United States Patent
Kikushima et al.

(10) Patent No.: US 9,070,863 B2
(45) Date of Patent: Jun. 30, 2015

(54) RESONATOR ELEMENT, RESONATOR, OSCILLATOR, ELECTRONIC APPARATUS, AND MOVING OBJECT

(71) Applicant: SEIKO EPSON CORPORATION, Tokyo (JP)

(72) Inventors: Masayuki Kikushima, Ina (JP); Masako Tanaka, Okaya (JP); Naohisa Obata, Minowa-machi (JP); Yukihiro Unno, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/191,961

(22) Filed: Feb. 27, 2014

(65) Prior Publication Data

US 2014/0253253 A1    Sep. 11, 2014

(30) Foreign Application Priority Data

Mar. 5, 2013 (JP) ................. 2013-042583
Mar. 29, 2013 (JP) ................. 2013-075016
Jan. 24, 2014 (JP) ................. 2014-011902

(51) Int. Cl.
| H01L 41/053 | (2006.01) |
|---|---|
| H01L 41/083 | (2006.01) |
| H03B 5/32 | (2006.01) |
| H03H 9/17 | (2006.01) |
| H01L 41/09 | (2006.01) |
| H03H 9/02 | (2006.01) |
| H03H 9/19 | (2006.01) |

(52) U.S. Cl.
CPC ............. *H01L 41/0906* (2013.01); *H03B 5/32* (2013.01); *H01L 41/083* (2013.01); *H03H 9/172* (2013.01); *H01L 41/0913* (2013.01); *H01L 41/053* (2013.01); *H03H 9/02023* (2013.01); *H03H 9/02062* (2013.01); *H03H 9/19* (2013.01)

(58) Field of Classification Search
CPC . H01L 41/053; H01L 41/083; H01L 41/0906; H01L 41/0913; H03B 5/30; H03B 5/32; H03H 9/17; H03H 9/172; H03H 9/21
USPC .......... 310/311, 348, 368, 370; 331/154, 156, 331/158
See application file for complete search history.

(56) References Cited

U.S. PATENT DOCUMENTS 5,307,034 A * 4/1994 Morita et al. ................. 333/187
7,098,574 B2   8/2006 Iwata
(Continued)

FOREIGN PATENT DOCUMENTS

JP    A-2001-144578    5/2001
JP    A-2002-33640     1/2002
(Continued)

*Primary Examiner* — Levi Gannon
(74) *Attorney, Agent, or Firm* — Oliff PLC

(57) ABSTRACT

A resonator element includes a piezoelectric substrate that includes a vibration portion, and a thick portion which is integrally formed with an outer edge excluding a partial outer edge in an outer edge of the vibration portion and which is thicker than the vibration portion, and a pair of excitation electrodes that are respectively provided on a first main surface and a second main surface of a vibration region which are in front and rear relationships. In addition, the piezoelectric substrate includes first and second beam portions that are provided along a fourth side of the vibration portion.

14 Claims, 36 Drawing Sheets

(56) References Cited

U.S. PATENT DOCUMENTS

| | | |
|---|---|---|
| 7,861,389 B2 * | 1/2011 | Naito et al. .................. 29/25.35 |
| 8,026,652 B2 | 9/2011 | Yasuike |
| 2012/0133248 A1 | 5/2012 | Kusano |
| 2012/0306321 A1 | 12/2012 | Ishii |
| 2013/0043959 A1 | 2/2013 | Ishii |
| 2013/0043960 A1 | 2/2013 | Ishii et al. |
| 2014/0203689 A1 | 7/2014 | Obata |
| 2014/0253253 A1 | 9/2014 | KIKUSHIMA et al. |
| 2014/0292437 A1 | 10/2014 | TANAKA et al. |

FOREIGN PATENT DOCUMENTS

| | | |
|---|---|---|
| JP | A-2002-198772 | 7/2002 |
| JP | A-2003-264446 | 9/2003 |
| JP | A-2004-165743 | 6/2004 |
| JP | A-2006-203700 | 8/2006 |
| JP | A-2009-164824 | 7/2009 |
| JP | A-2012-253630 | 12/2012 |
| JP | A-2013-42410 | 2/2013 |
| JP | A-2013-42440 | 2/2013 |
| JP | A-2013-46189 | 3/2013 |
| JP | 2014-138413 A | 7/2014 |

* cited by examiner

RESONATOR ELEMENT, RESONATOR, OSCILLATOR, ELECTRONIC APPARATUS, AND MOVING OBJECT

BACKGROUND

1. Technical Field

The present invention relates to a resonator element, a resonator, an oscillator, an electronic apparatus, and a moving object.

2. Related Art

An AT cut quartz crystal resonator element has thickness shear vibration as a vibration mode of main vibration for excitation, and is suitable for miniaturization and realizing high frequency. In addition, the AT cut quartz crystal resonator element shows a third-order curve which is superior in a frequency-temperature characteristic, and is thus used in various applications such as piezoelectric oscillators and electronic apparatuses.

As such an AT cut quartz crystal resonator element, JP-A-2009-164824 discloses an embodiment of an AT cut quartz crystal resonator element with an inverted mesa structure which is a structure in which, for example, thick portions are respectively connected to three sides of a rectangular thin vibration portion, and one side of the thin vibration portion is opened from the thick portions. With this configuration, a wide vibration region can be secured, and miniaturization can be achieved.

However, in the AT cut quartz crystal resonator element of the embodiment, since the open width is the same as a width of the vibration portion in the same direction as the open width, if vibration (particularly, acceleration in the thickness direction) is applied thereto, the vibration portion is deformed. If the vibration portion is deformed, a vibration characteristic varies, and thus there is a problem in that a desired oscillation characteristic cannot be obtained.

SUMMARY

An advantage of some aspects of the invention is to provide a resonator element which can reduce a variation in a vibration characteristic due to an external force such as acceleration (vibration) so as to show a stable vibration characteristic, a resonator, an oscillator, an electronic apparatus, and a moving object.

The invention can be implemented as the following forms or application examples.

Application Example 1

This application example is directed to a resonator element including a substrate that includes a first region having a vibration region which performs thickness shear vibration, and a second region which is integrally formed with an outer edge excluding a partial outer edge in an outer edge of the first region and which is thicker than the first region; a pair of excitation electrodes that are respectively provided on a first main surface and a second main surface of the vibration region which are in front and rear relationships; and a beam portion that is provided along the outer edge which does not overlap a part near a partial outer edge of a part interposed between the pair of excitation electrodes of the vibration region in the partial outer edge, and that is thicker than the first region, when the partial outer edge is viewed along the main surface and from a direction perpendicular to a vibration direction of the thickness shear vibration.

With this configuration, it is possible to provide a resonator element which can reduce a variation in a vibration characteristic due to an external force such as acceleration (vibration) so as to show a stable vibration characteristic.

Application Example 2

In the resonator element according to the application example described above, it is preferable that, when a length of the beam portion in the vibration direction is set to L1, and a thickness of the vibration portion is set to $D_2$, a relationship of $10 \times D_2 \leq L1 \leq 15 \times D_2$ is satisfied.

With this configuration, it is possible to more effectively reduce a variation in a vibration characteristic due to an external force such as vibration.

Application Example 3

In the resonator element according to the application example described above, it is preferable that, when a width of the beam portion in the direction perpendicular to the vibration direction is set to W1, and a thickness of the vibration portion is set to $D_2$, a relationship of $3 \times D_2 \leq W1 \leq 10 \times D_2$ is satisfied.

With this configuration, it is possible to more effectively reduce a variation in a vibration characteristic due to an external force such as vibration.

Application Example 4

In the resonator element according to the application example described above, it is preferable that a contour of the first region includes first and second sides that are arranged with the first region interposed therebetween and are formed in the direction perpendicular to the vibration direction in a plan view; a third side that connects one end of the first side to one end of the second side and is formed in the vibration direction; and a fourth side that connects the other end of the first side to the other end of the second side and is formed in the vibration direction. In addition, preferably, the second region includes a first thick portion that is provided along the first side; a second thick portion that is provided along the second side; and a third thick portion that is provided along the third side. Further, preferably, the beam portion is provided along the fourth side, and is connected to at least one of the first thick portion and the second thick portion.

With this configuration, the rigidity of the vibration portion is increased, and thus it is possible to reduce spurious vibration of the vibration portion.

Application Example 5

In the resonator element according to the application example described above, it is preferable that an edge of the beam portion includes a tilt edge part that is tilted with respect to the vibration direction of the thickness shear vibration and the direction perpendicular to the vibration direction in a plan view.

With this configuration, it is possible to reduce stress concentration on the vicinity of the beam portion.

Application Example 6

In the resonator element according to the application example described above, it is preferable that a tilt angle of the tilt edge part relative to the vibration direction is 30° or more and 60° or less.

With this configuration, it is possible to further reduce stress concentration on the vicinity of the beam portion.

Application Example 7

In the resonator element according to the application example described above, it is preferable that a fixation portion which is installed in a target object is provided in the first thick portion, and a length of the second thick portion in the vibration direction of the thickness shear vibration is 40 μm or more and 100 μm or less.

With this configuration, it is possible to reduce mass of the front end part of the resonator element while ensuring the mechanical strength of the resonator element.

Application Example 8

This application example is directed to a resonator including the resonator element of the application example described above; and a package that accommodates the resonator element therein.

With this configuration, it is possible to obtain a resonator with high reliability.

Application Example 9

This application example is directed to an oscillator including the resonator element of the application example described above; and a circuit that drives the resonator element.

With this configuration, it is possible to obtain an oscillator with high reliability.

Application Example 10

This application example is directed to an electronic apparatus including the resonator element of the application example described above.

With this configuration, it is possible to obtain an electronic apparatus with high reliability.

Application Example 11

This application example is directed to a moving object including the resonator element of the application example described above.

With this configuration, it is possible to obtain a moving object with high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a resonator element, a resonator, an oscillator, an electronic apparatus, and a moving object according to embodiments of the invention will be described in detail with reference to the drawings.

1. Resonator Element

First, a resonator element to which the invention is applied will be described.

First Embodiment

Figure 1:
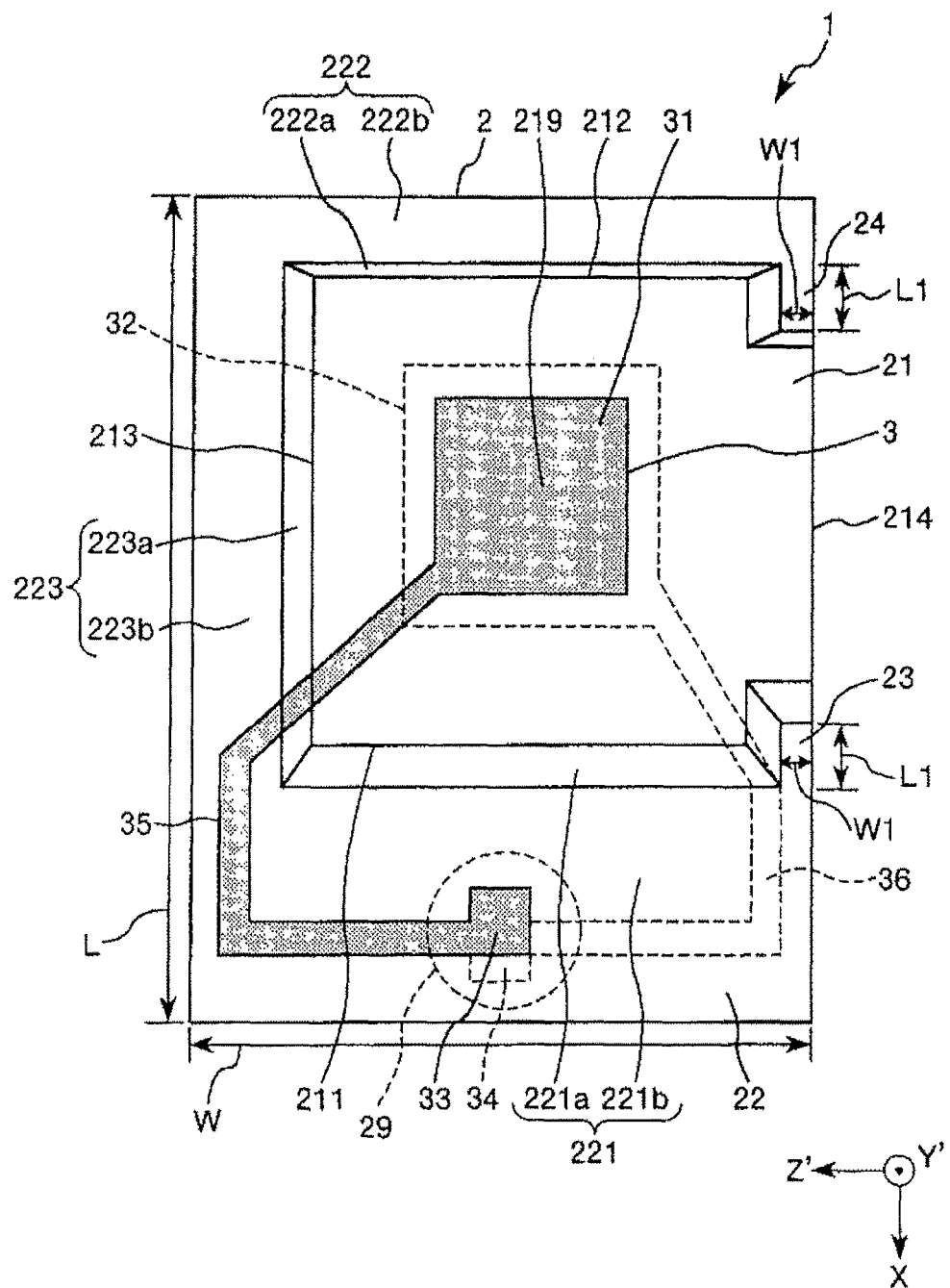
FIG. 1 is a plan view of a resonator element according to a first embodiment of the invention.
Figure 2:
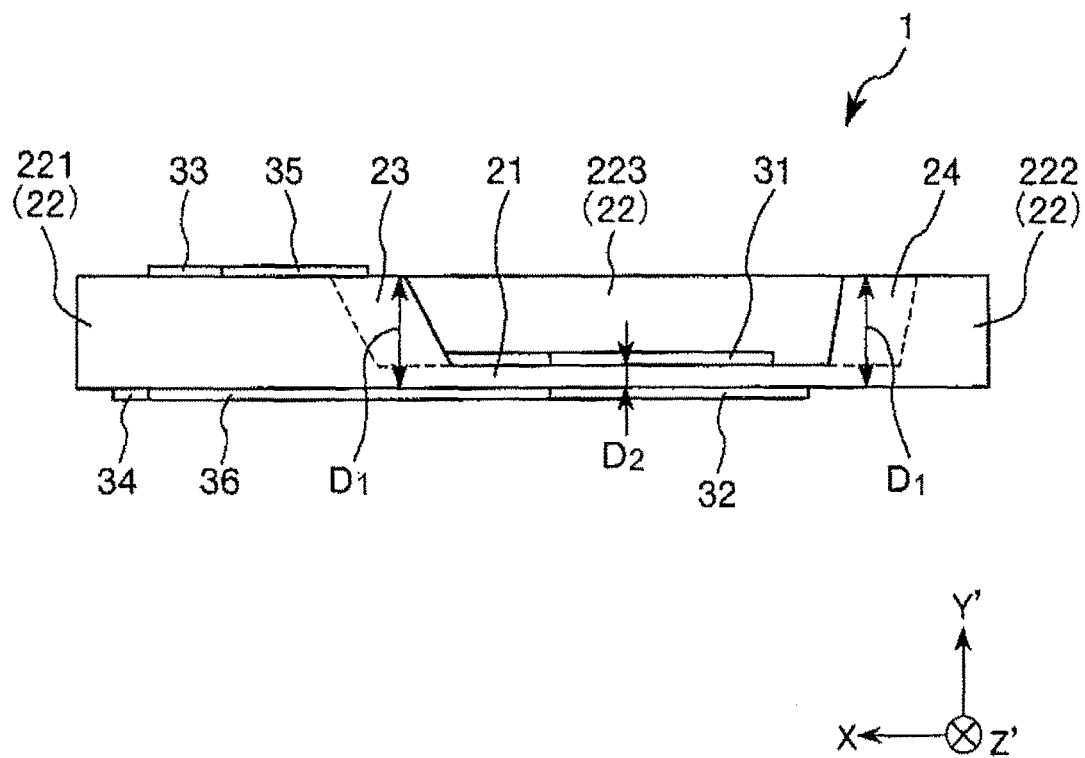
FIG. 2 is a side view of the resonator element illustrated in FIG. 1.
Figure 3:
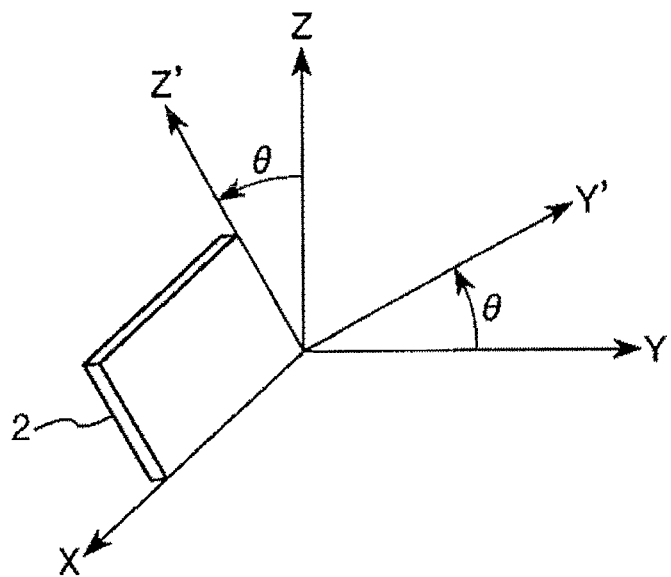
FIG. 3 is a diagram illustrating a relationship between an AT cut quartz crystal substrate and crystal axes.

FIG. 1 is a plan view of a resonator element according to a first embodiment of the invention. FIG. 2 is a side view of the resonator element illustrated in FIG. 1. FIG. 3 is a diagram illustrating a relationship between an AT cut quartz crystal substrate and crystal axes.

As illustrated in FIGS. 1 and 2, a resonator element 1 includes a piezoelectric substrate 2 and an electrode 3 formed on the piezoelectric substrate 2.

Piezoelectric Substrate

The piezoelectric substrate 2 is a plate-shaped quartz crystal substrate. Here, quartz crystal which is a material of the piezoelectric substrate 2 belongs to a trigonal system, and thus has crystal axes X, Y and Z which are perpendicular to each other as illustrated in FIG. 3. The X axis, the Y axis, and the Z axis are respectively called an electrical axis, a mechanical axis, and an optical axis. The piezoelectric substrate 2 of the present embodiment is formed of a "rotated Y-cut quartz crystal substrate" which is taken along a plane obtained by rotating the XZ plane by a predetermined angle θ with respect to the X axis. For example, in a case of the AT cut quartz crystal substrate, the angle θ is about 35° 15'.

In addition, hereinafter, a Y axis and a Z axis rotated with respect to the X axis by the angle θ are set to a Y' axis and a Z' axis. In other words, the plate-shaped piezoelectric substrate 2 has a thickness in the Y' axis direction and has an area in the XZ' plane direction. In addition, the piezoelectric substrate 2 is not limited to an AT-cut piezoelectric substrate, and may use, for example, a BT-cut piezoelectric substrate as long as it can excite thickness shear vibration.

The piezoelectric substrate 2 has a rectangular shape in a plan view. More specifically, the piezoelectric substrate 2 is formed in a substantially rectangular shape which has a long side in the X axis direction and a short side in the Z' axis direction in a plan view. Here, upon comparison of a frequency variation when pressure is applied to both ends of the piezoelectric substrate 2 in the X axis direction with a frequency variation when the same pressure is applied to both ends thereof in the Z' axis direction, the frequency variation when the pressure is applied to both ends in the Z' axis direction is smaller than the frequency variation when the pressure is applied to both ends in the X axis direction. For this reason, as in the present embodiment, an appearance of the piezoelectric substrate 2 is made to have a rectangular shape which is longer in the X axis direction than in the Z' axis direction, and the piezoelectric substrate 2 is fixed to a predetermined position at one end X axis direction, thereby reducing a frequency variation due to stress.

A ratio of a length (a length in the X axis direction) L and a width (a length in the Z' axis direction) W of the piezoelectric substrate 2 is not particularly limited, but is preferably, for example, about 1.26:1. In addition, an exterior of the piezoelectric substrate 2 is not limited to a rectangular shape, and may be, for example, a square, a pentagon or higher polygon, and a circular shape (including a perfect circle, an oval, an ellipse, and the like). In a case where a plan-view shape is a polygon, a corner thereof may be chamfered.

The piezoelectric substrate 2 includes a vibration portion (first region) 21 having a thin vibration region 219, a thick portion (second region) 22 which is integrally formed with the vibration portion 21 and is thicker than the vibration region 219, and first and second beam portions (beam portions) 23 and 24 which are integrally formed with the vibration portion 21. The piezoelectric substrate 2 can be simply formed by patterning a quartz crystal substrate by using wet etching. In addition, the vibration region 219 is a region where vibration energy of the resonator element 1 is confined.

The vibration portion 21 has a rectangular shape in a plan view. In addition, the vibration portion 21 is disposed so as to be biased in the −X axis direction and Z' axis direction with respect to the center of the piezoelectric substrate 2, and a part of the outer edge thereof is exposed from the thick portion 22. Specifically, a contour of the vibration portion 21 has a first side (outer edge) 211, a second side (outer edge) 212, a third side (outer edge) 213, and a fourth side (outer edge) 214. The first side 211 and the second side 212 oppose each other in the X axis direction, and both sides extend in the Z' axis direction. The first side 211 is located on the +X axis side (base end side), and the second side 212 is located on the −X axis side (front end side). On the other hand, the third side 213 and the fourth side 214 oppose each other in the Z' axis direction, and both sides extend in the X axis direction. The third side 213 is located on the +Z' axis, and connects the corners of the first side 211 and the second side 212 on the Z' axis side to each other. Conversely, the fourth side 214 is located on the −Z' axis side, and connects the corners of the first side 211 and the second side 212 on the −Z' axis side to each other.

The thick portion 22 is provided so as to surround the three sides of the vibration portion 21. As illustrated in FIG. 2, a surface (a main surface in the +Y' axis direction) of the thick portion 22 is provided so as to further protrude in the +Y' axis direction than a surface (a main surface in the +Y' axis direction) of the vibration portion 21. On the other hand, a rear surface (a main surface in the −Y' axis direction) of the thick portion 22 is provided on the same plane as a rear surface (a main surface in the −Y' axis direction) of the vibration portion 21.

As illustrated in FIG. 1, the thick portion 22 includes a first thick section 221 which is disposed along the first side 211 of the vibration portion 21, a second thick section 222 which is disposed along the second side 212, and a third thick section 223 which is disposed along the third side 213. The thick portion 22 is integrally formed along the three sides of the vibration portion 21 so as to form a substantially "C" shape. The thick portion 22 is formed in this shape, and thus the vibration portion 21 is opened (exposed) from the thick portion 22 at the fourth side 214. As mentioned above, the vibration portion 21 is opened from the thick portion 22 at the fourth side 214, in other words, a thick portion is not provided along the fourth side 214, and thus it is possible to miniaturize the resonator element 1. In addition, the three sides of the vibration portion 21 are surrounded by the thick portion 22, so as to increase rigidity of the vibration portion 21, thereby reducing spurious vibration (the occurrence of a spurious vibration mode) of the vibration portion 21.

Particularly, as in the present embodiment, the third thick section 223 is provided on the +Z' axis side with respect to the vibration portion 21, and thus a width (a length in the Z' axis direction) of a tilt part 223a (described later) can be shortened as compared with a case where the third thick section 223 is provided on the −Z' axis side. For this reason, it is possible to further miniaturize the resonator element 1 by using the thick portion 22.

The first thick section 221 includes a tilt part (residue part) 221a which is connected to the first side 211 of the vibration portion 21 and gradually increases its thickness in the +X axis direction, and a thick portion main body 221b which is connected to the edge of the tilt part 221a in the +X axis direction and has a substantially constant thickness. Similarly, the second thick section 222 includes a tilt part (residue part) 222a which is connected to the second side 212 of the vibration portion 21 and gradually increases its thickness in the −X axis direction, and a thick portion main body 222b which is connected to the edge of the tilt part 222a in the −X axis direction and has a substantially constant thickness. In addition, the third thick section 223 includes a tilt part (residue part) 223a which is connected to the third side 213 of the vibration portion 21 and gradually increases its thickness in the +Z' axis direction, and a thick portion main body 223b which is connected to the edge of the tilt part 223a in the +Z' axis direction and has a substantially constant thickness.

A mount portion (fixation portion) 29 is provided on a surface of the thick portion main body 221b of the first thick section 221, that is, on the base end side of the resonator element 1. In addition, the resonator element 1 is fixed to a target object (a base 41 described later) at the mount portion 29 via a fixing member such as an adhesive. A position of the mount portion 29 is not particularly limited, and, for example, the mount portion 29 may be provided on the rear surface of the thick portion main body 221b.

The resonator element 1 has the first and second beam portions 23 and 24 which are provided along the outer edge which does not overlap a part near the fourth side 214 of a part interposed between a pair of excitation electrodes 31 and 32 of the vibration region 219 in the fourth side 214, and which are thicker than the vibration portion 21, when the fourth side 214 (a partial outer edge) is viewed along the main surface and from a direction perpendicular to the vibration direction of the thickness shear vibration.

The first beam portion 23 protrudes in the −X axis direction from the first thick section 221, and extends up to the middle of the fourth side 214 along the fourth side 214. The second beam portion 24 protrudes in the +X axis direction from the second thick section 222, and extends up to the middle of the fourth side 214 along the fourth side 214. Front ends of the first and second beam portions 23 and 24 oppose each other and are spaced apart from each other. Therefore, a part (exposed part) where the side surface of the contour of the vibration portion 21 is exposed is present in the fourth side 214 of the vibration portion 21. These first and second beam portions 23 and 24 are provided, and thus it is possible to reduce sensitivity to vibration (particularly, acceleration in the Y' axis direction) of the resonator element 1. For this reason, it is possible to provide the resonator element 1 which has a small difference (fluctuation) in a vibration characteristic between a state of vibration being applied and a state of vibration not being applied, and can show a stable vibration characteristic regardless of influence of the vibration. Particularly, as in the present embodiment, the first and second beam portions 23 and 24 are provided on both sides of the fourth side 214, and thus the above-described effect becomes more notable.

Specifically, in the resonator element 1 (that is, the resonator element of the related art) with no first and second beam portions 23 and 24, since the fourth side 214 is opened from the thick portion 22, when vibration (particularly, acceleration in the Y' axis direction) is applied, the fourth side 214 side is more easily deformed than the third side 213 side. In other words, when the acceleration in the Y' axis direction is applied, stress more easily concentrates on the fourth side 214 side than the third side 213 side. For this reason, when vibration is applied, a stress distribution of the vibration portion 21 is nonuniform. The nonuniformity of the stress distribution is considered to contribute to a variation in the vibration characteristic. In addition, there is a concern that the vicinity of the fourth side 214 of the vibration portion 21 may unintentionally vibrate, and thus a spurious vibration mode may be generated. Therefore, the first and second beam portions 23 and 24 are provided so as to increase the rigidity of the fourth side 214 side of the vibration portion 21, that is, the rigidity of the vicinity of the fourth side 214 is made close to the rigidity of the vicinity of the third side 213. Thus, the nonuniformity of the stress distribution is reduced (preferably, the stress distribution becomes uniform), and, as a result, the variation in the vibration characteristic when vibration is applied is effectively reduced. Further, unintentional vibration in the vicinity of the fourth side 214 of the vibration portion 21 is reduced, and thus the occurrence of a spurious vibration mode can also be suppressed. For this reason, it is possible to provide the resonator element 1 which can show a stable vibration characteristic regardless of influence of vibration.

In addition, a surface (main surface) of the first beam portion 23 is located on the same plane as the surface of the first thick section 221, and a surface (main surface) of the second beam portion 24 is located on the same plane as the surface of the second thick section 222. Accordingly, the first and second beam portions 23 and 24 can be made sufficiently thick from the viewpoint of increasing the rigidity of the vibration portion 21. For this reason, the above-described effect can be more effectively exhibited. Further, boundaries between the first and second beam portions 23 and 24 and the thick portion 22 are continuously located (a step difference is not formed), and thus it is also possible to prevent stress from concentrating on the boundaries between the first and second beam portions 23 and 24 and the thick portion 22. Furthermore, a thickness $D_1$ of each of the first and second beam portions 23 and 24 (a thickness of the piezoelectric substrate 2 at the first and second beam portions 23 and 24) is not particularly limited, but when a thickness (average thickness) of the vibration portion 21 is set to $D_2$, a relationship of $2D_2 \leq D_1 \leq 10D_2$ is preferably satisfied, and a relationship of $4D_2 \leq D_1 \leq 6D_2$ is more preferably satisfied. If these relationships are satisfied, it is possible to sufficiently increase the rigidity of the fourth side 214 side of the vibration portion 21 while preventing the resonator element 1 from being excessively thickened (large-sized).

The first and second beam portions 23 and 24 are provided on the surface of the vibration portion 21, and the outer edges (the outer edges opposite sides to the third thick section 223) of the outsides thereof are provided along the fourth side 214. As mentioned above, the outer edges of the outsides of the first and second beam portions 23 and 24 are provided along the fourth side 214 so as to form an exterior of the piezoelectric substrate 2 in a simple shape, thereby easily manufacturing the piezoelectric substrate 2.

When a length (a length in the X axis direction on the surface) of each of the first and second beam portions 23 and 24 is set to L1, L1 is preferably equal to or larger than $10D_2$. If L1 has such a length, it is possible to more effectively increase the rigidity of the fourth side 214 side of the vibration portion 21. An upper limit value of L1 is not particularly limited, and is different depending on a length of the vibration portion 21, but is preferably, for example, equal to or smaller than $15D_2$. Although different depending on a width W1 of each of the first and second beam portions 23 and 24, even if the length L1 is equal to or larger than that, an additional effect cannot be expected to be achieved any longer. In addition, the lengths L1 of the first and second beam portions 23 and 24 may be the same as or different from each other.

When a width (a length in the Z' axis direction on the surface) of each of the first and second beam portions 23 and 24 is set to W1, W1 preferably satisfies a relationship of $3D_2 \leq W1 \leq 10D_2$, and more preferably satisfies $5D_2 \leq W1 \leq 7D_2$. If these relationships are satisfied, it is possible to secure a sufficiently wide vibration region 219 and to sufficiently increase the rigidity of the fourth side 214 side of the vibration portion 21 without increasing a size of the vibration portion 21.

Electrode

The electrode 3 includes a pair of excitation electrodes 31 and 32, a pair of pad electrodes 33 and 34, and a pair of lead electrodes 35 and 36. The excitation electrodes 31 and 32 are formed on a front surface (first main surface) and a rear surface (second main surface) which are mutually in front and rear relationships of the vibration region 219. Specifically, the excitation electrode 31 is formed on the front surface of the vibration region 219, and the excitation electrode 32 is formed on the rear surface of the vibration region 219. In addition, the excitation electrode 32 is disposed so as to overlap the excitation electrode 31 in a plan view. The excitation electrodes 31 and 32 have a substantially square shape. Further, an area of the excitation electrode 32 on the rear surface is larger than an area of the excitation electrode 31 on the front surface, and the entire region of the excitation electrode 31 is located inside the excitation electrode 32 in a plan view of the resonator element 1. Accordingly, an energy confinement coefficient due to a mass effect of the excitation electrodes 31 and 32 is not increased more than necessary.

The pad electrode 33 is formed in the mount portion 29 on the front surface of the thick portion main body 221b. In addition, the pad electrode 33 is electrically connected to the excitation electrode 31 via the lead electrode 35. The lead electrode 35 which extends from the pad electrode 33 is connected to the pad electrode 33 via the tilt part 223a and the thick portion main bodies 223b and 221b from the front surface of the vibration portion 21. On the other hand, the pad electrode 34 is formed on the rear surface of the thick portion main body 221b. In addition, the pad electrode 34 is electrically connected to the excitation electrode 32 via the lead electrode 36. The lead electrode 36 which extends from the pad electrode 34 is connected to the pad electrode 34 via the rear surface of the vibration portion 21 and the rear surface of the first thick section 221.

Here, in the present embodiment, the pad electrodes 33 and 34 are disposed so as to oppose each other via the piezoelectric substrate 2. With this arrangement, electrical connection using wire bonding can be more reliably performed as will be described later in a resonator 10.

The lead electrode 35 is disposed so as to pass through the edge on the +Z' axis side, and the lead electrode 36 is disposed so as to pass through the edge on the −Z' axis side. For this reason, the lead electrodes 35 and 36 are provided via the piezoelectric substrate 2 so as not to intersect (oppose) each other. With this arrangement, electrostatic coupling between the lead electrodes 35 and 36 is reduced, and thus it is possible to minimize an increase in electrostatic capacitance. An arrangement of the pad electrodes 33 and 34 or a path of the lead electrodes 35 and 36 is not limited to that of the present embodiment.

The excitation electrodes 31 and 32, the pad electrodes 33 and 34, and the lead electrodes 35 and 36 may be respectively formed of, for example, metal coating films in which gold (Au) is laminated on a base layer such as chrome (Cr) or nickel (Ni). In addition, for example, the excitation electrodes 31 and 32, the pad electrodes 33 and 34, and the lead electrodes 35 and 36 may have different configurations (a material and a thickness of each layer). For example, the excitation electrodes 31 and 32 may be formed by laminating a thin film of Au on a base layer of Ni, and the pad electrodes 33 and 34 and the lead electrodes 35 and 36 may be formed by laminating a thin film of Au on a base layer of Cr. Further, a thickness of the Au thin film of the excitation electrodes 31 and 32 is preferably set so that main vibration is in a confinement mode, and an adjacent inharmonic mode becomes a propagation mode (unconfinement mode) if at all possible, in a range in which an ohmic loss is not increased.

A shape of each of the excitation electrodes 31 and 32 of the present embodiment is a square, but is not limited thereto. For example, the excitation electrode 31 may have a circular shape, and the excitation electrode 32 may have a square shape of which an area is considerably larger than an area of the excitation electrode 31. In addition, for example, the excitation electrode 31 may have an elliptical shape, and the excitation electrode 32 may have a square shape of which an area is considerably larger than an area of the excitation electrode 31.

In the present embodiment, although the thick portion 22 and the first and second beam portions 23 and 24 have a structure of protruding from only one side of the vibration portion 21, but are not limited thereto, and the thick portion 22 and the first and second beam portions 23 and 24 may have a structure of protruding from both main surfaces of the vibration portion 21 by patterning both surfaces of the quartz crystal substrate by using wet etching.

Second Embodiment

Next, a resonator element according to a second embodiment of the invention will be described.

Figure 4:
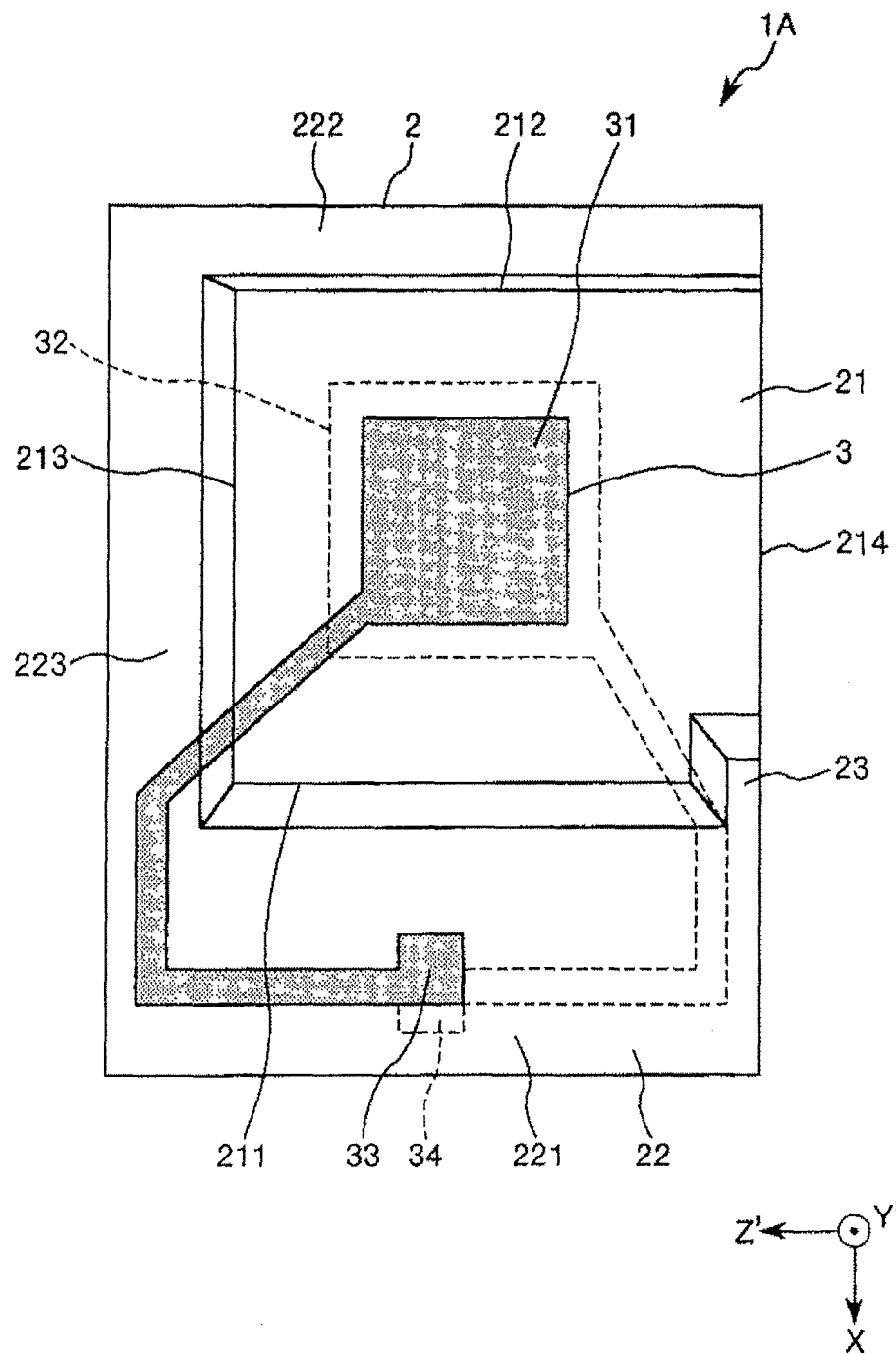
FIG. 4 is a plan view of a resonator element according to a second embodiment of the invention.

FIG. 4 is a plan view of a resonator element according to the second embodiment of the invention.

Hereinafter, the resonator element according to the second embodiment will be described mainly based on a difference from the above-described first embodiment, and description of the same content will not be repeated.

The resonator element according to the second embodiment of the invention is the same as the resonator element according to the first embodiment except that the second beam portion is omitted. In addition, the same constituent elements as the ones in the first embodiment are given the same reference numerals.

In the resonator element 1A illustrated in FIG. 4, only the first beam portion 23 is formed as a beam portion. In other words, the resonator element 1A has a configuration in which the second beam portion 24 is omitted from the resonator element 1 of the first embodiment.

The second embodiment can also exhibit the same effects as the first embodiment.

Third Embodiment

Next, a resonator element according to a third embodiment of the invention will be described.

Figure 5:
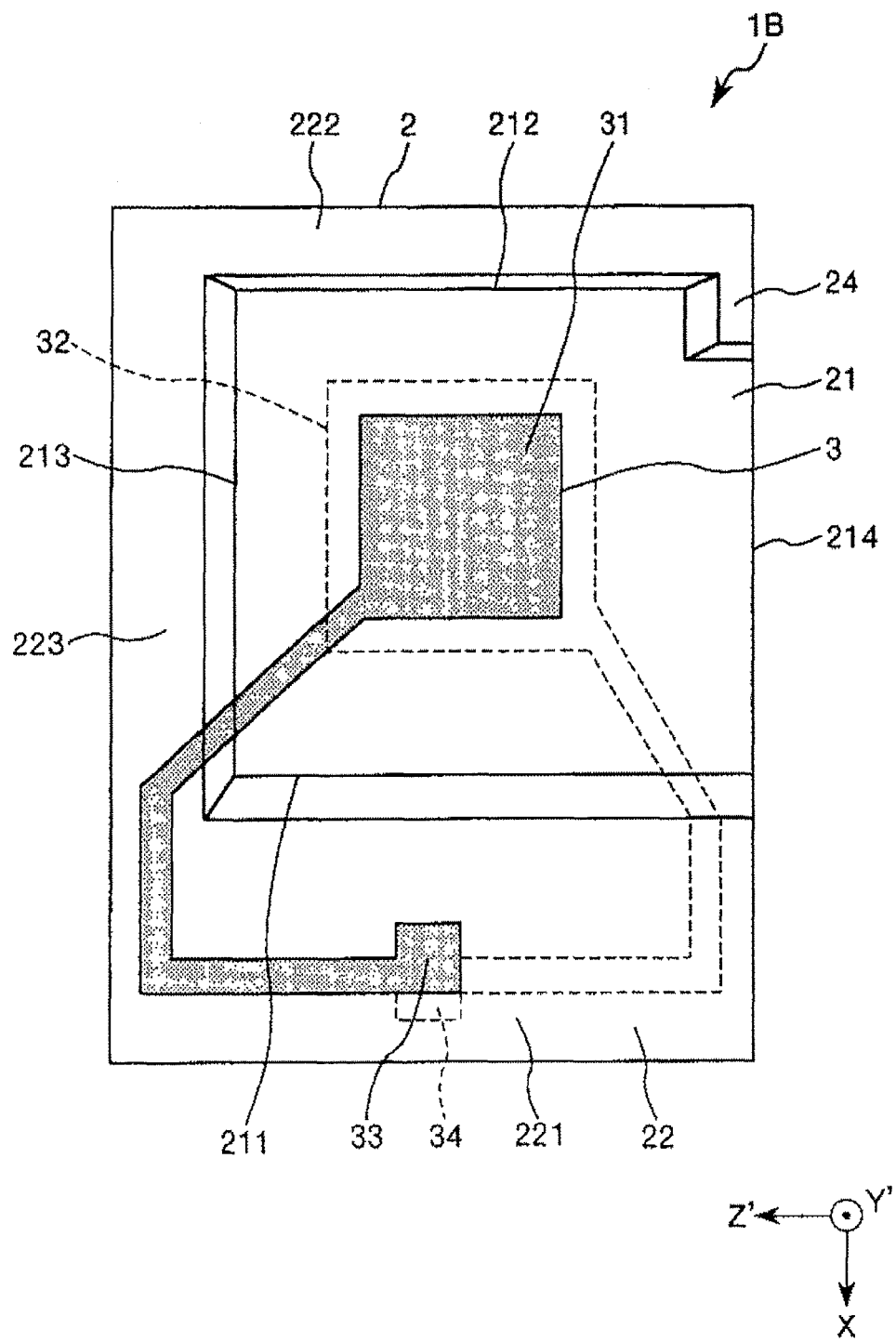
FIG. 5 is a plan view of a resonator element according to a third embodiment of the invention.

FIG. 5 is a plan view of a resonator element according to the third embodiment of the invention.

Hereinafter, the resonator element according to the third embodiment will be described mainly based on a difference from the above-described first embodiment, and description of the same content will not be repeated.

The resonator element according to the third embodiment of the invention is the same as the resonator element according to the first embodiment except that the first beam portion is omitted. In addition, the same constituent elements as the ones in the first embodiment are given the same reference numerals.

In the resonator element 1B illustrated in FIG. 5, only the second beam portion 24 is formed as a beam portion. In other words, the resonator element 1B has a configuration in which the first beam portion 23 is omitted from the resonator element 1 of the first embodiment.

The third embodiment can also exhibit the same effects as the first embodiment.

Fourth Embodiment

Next, a resonator element according to a fourth embodiment of the invention will be described.

Figure 6:
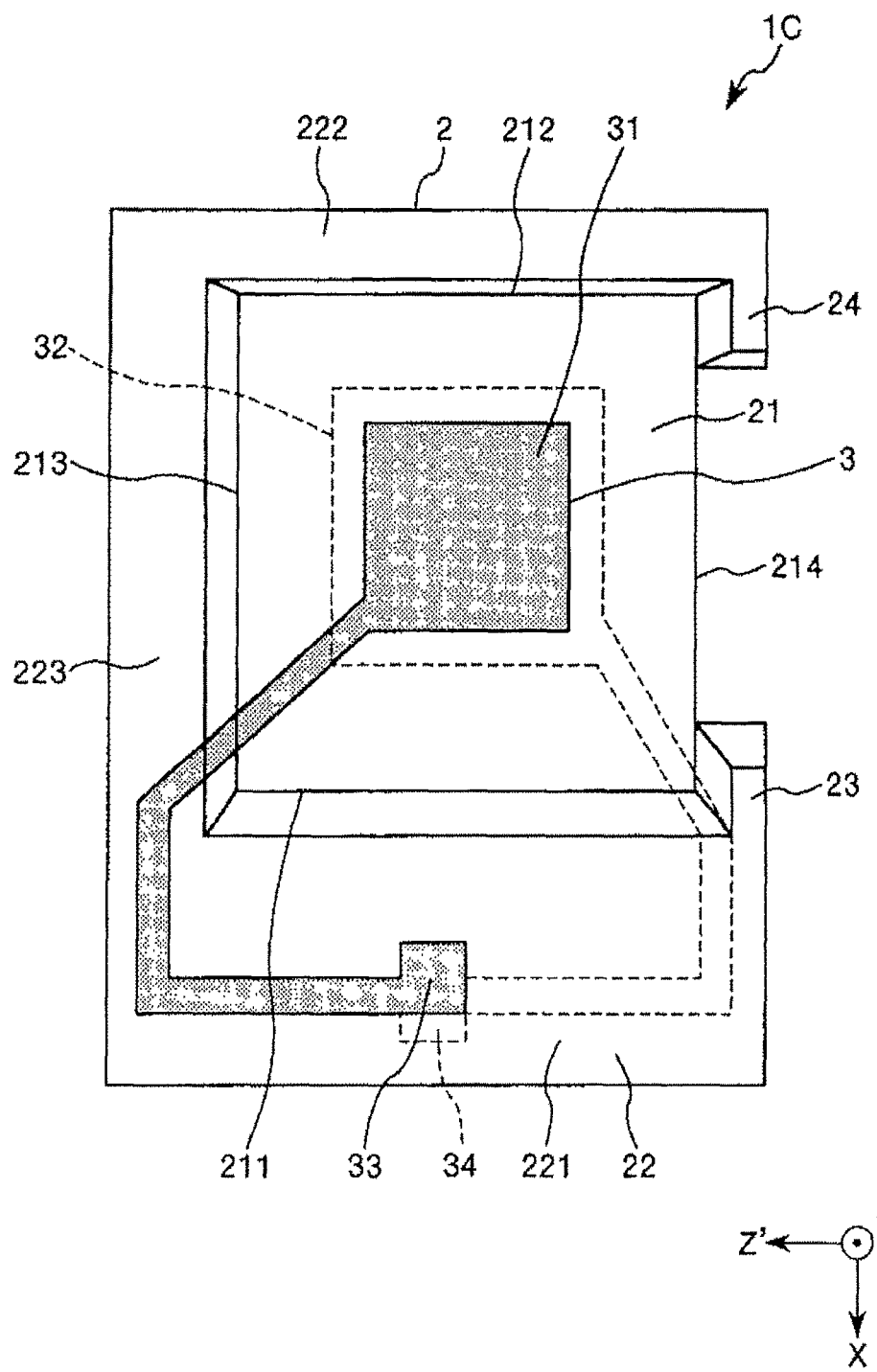
FIG. 6 is a plan view of a resonator element according to a fourth embodiment of the invention.

FIG. 6 is a plan view of a resonator element according to the fourth embodiment of the invention.

Hereinafter, the resonator element according to the fourth embodiment will be described mainly based on a difference from the above-described first embodiment, and description of the same content will not be repeated.

The resonator element according to the fourth embodiment of the invention is the same as the resonator element according to the first embodiment except that the first and second beam portions have a different arrangement. In addition, the same constituent elements as the ones in the first embodiment are given the same reference numerals.

In the resonator element 1C illustrated in FIG. 6, the first and second beam portions 23 and 24 are provided around the vibration portion 21, and outer edges (the outer edges on the third thick section 223 side) of the insides thereof are provided along the fourth side 214. In other words, the outer edges of the insides of the first and second beam portions 23 and 24 are connected to the fourth side 214. As mentioned above, the outer edges of the insides of the first and second beam portions 23 and 24 are provided along the fourth side 214, and thus it is possible to secure a wider vibration portion 21, for example, than in the first embodiment.

The fourth embodiment can also exhibit the same effects as the first embodiment.

Fifth Embodiment

Next, a resonator element according to a fifth embodiment of the invention will be described.

Figure 7:
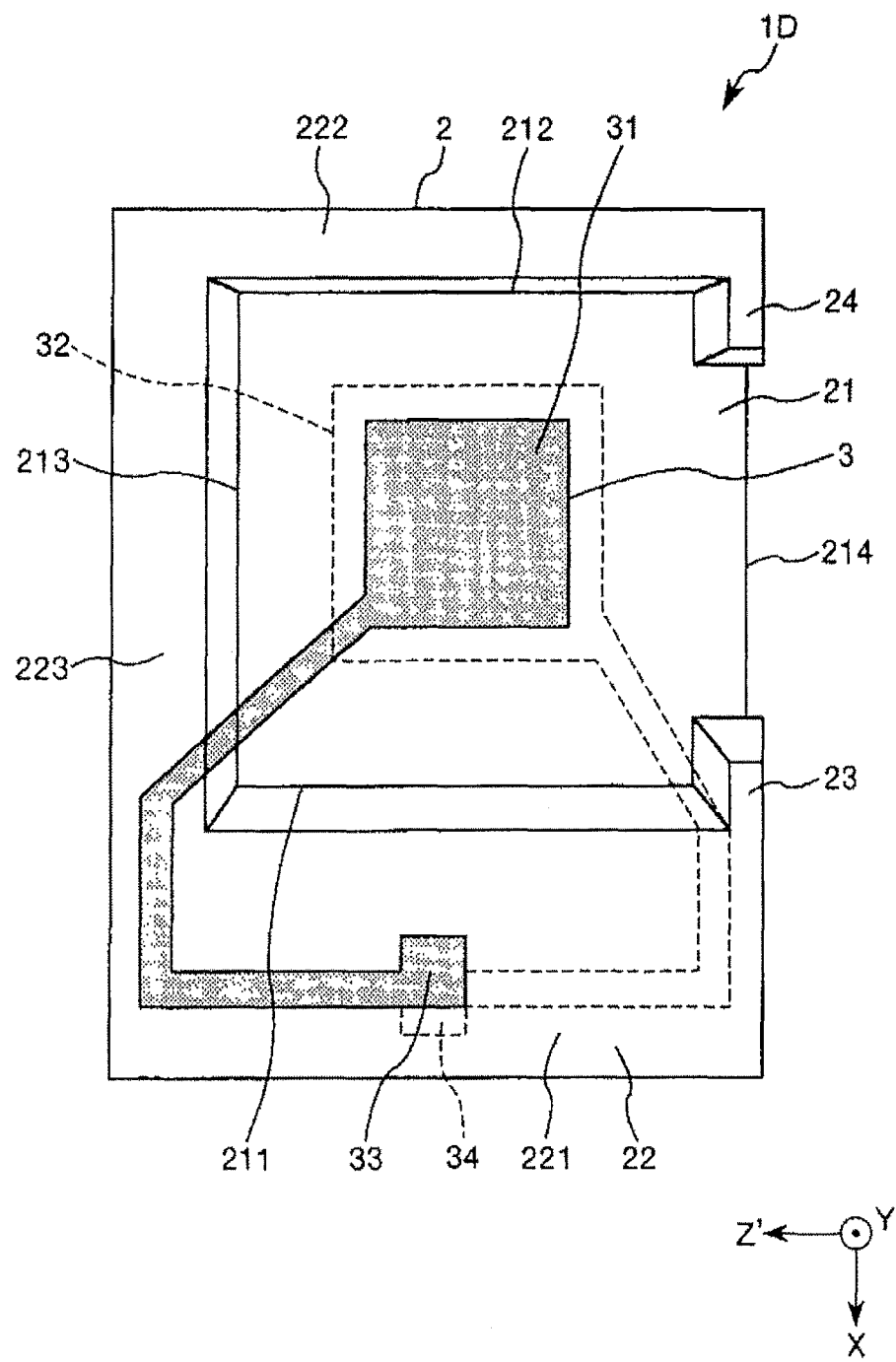
FIG. 7 is a plan view of a resonator element according to a fifth embodiment of the invention.

FIG. 7 is a plan view of a resonator element according to the fifth embodiment of the invention.

Hereinafter, the resonator element according to the fifth embodiment will be described mainly based on a difference from the above-described first embodiment, and description of the same content will not be repeated.

The resonator element according to the fifth embodiment of the invention is the same as the resonator element according to the first embodiment except that the first and second beam portions have a different arrangement. In addition, the same constituent elements as the ones in the first embodiment are given the same reference numerals.

In the resonator element 1D illustrated in FIG. 7, the first and second beam portions 23 and 24 are provided along the fourth side 214 so that the fourth side 214 is located between the outer edges of the insides and the outer edges of the outsides thereof in a plan view.

The fifth embodiment can also exhibit the same effects as the first embodiment.

Sixth Embodiment

Next, a resonator element according to a sixth embodiment of the invention will be described.

Figure 8:
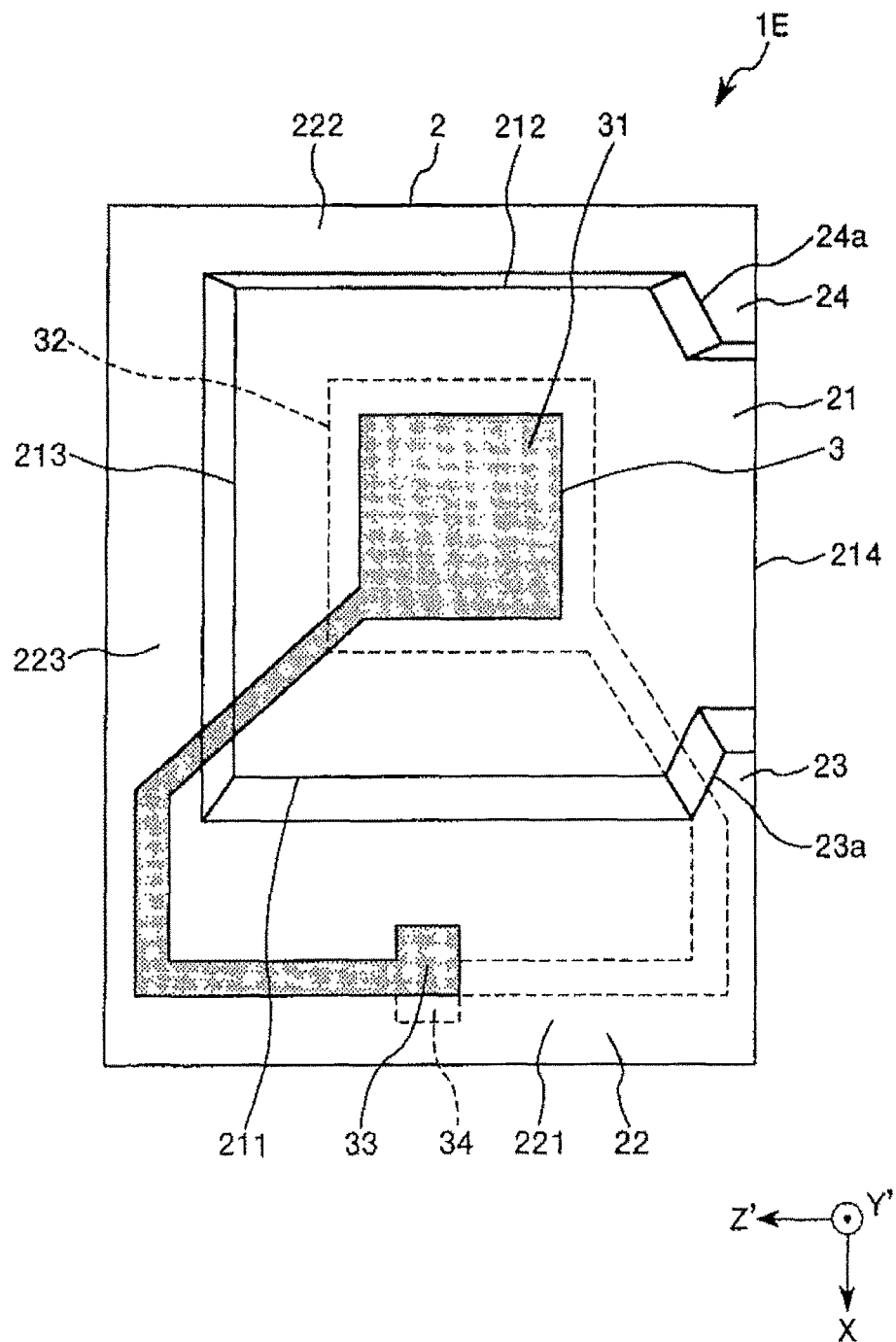
FIG. 8 is a plan view of a resonator element according to a sixth embodiment of the invention.

FIG. 8 is a plan view of a resonator element according to the sixth embodiment of the invention.

Hereinafter, the resonator element according to the sixth embodiment will be described mainly based on a difference from the above-described first embodiment, and description of the same content will not be repeated.

The resonator element according to the sixth embodiment of the invention is the same as the resonator element according to the first embodiment except that the first and second beam portions have a different shape. In addition, the same constituent elements as the ones in the first embodiment are given the same reference numerals.

In the resonator element 1E illustrated in FIG. 8, the first and second beam portions 23 and 24 have a tapered shape whose width is gradually reduced toward the front ends of the first and second beam portions 23 and 24. The outer edges (the outer edges on opposite sides to the third thick section 223) of the outsides of the first and second beam portions 23 and 24 are formed in a straight line extending in the X axis direction in a plan view. On the other hand, the outer edges (the outer edges on the third thick section 223) of the insides of the first and second beam portions 23 and 24 are formed of tilt edge parts 23a and 24a which are formed in straight lines extending in directions which are respectively tilted with respect to both of the X axis direction and the Z' axis direction in a plan view. As mentioned above, the first and second beam portions 23 and 24 have a tapered shape, and thus the first and second beam portions 23 and 24 can be made to more consecutively extend from the thick portion 22, for example, than in the resonator element 1 of the first embodiment. For this reason, it is possible to reduce stress concentration on the vicinities of boundaries between the first and second beam portions 23 and 24 and the thick portion 22 in the vibration portion 21. As a result, it is possible to more effectively minimize the nonuniformity of the stress distribution of the vibration portion 21.

The sixth embodiment can also exhibit the same effects as the first embodiment.

Seventh Embodiment

Next, a resonator element according to a seventh embodiment of the invention will be described.

Figure 9:
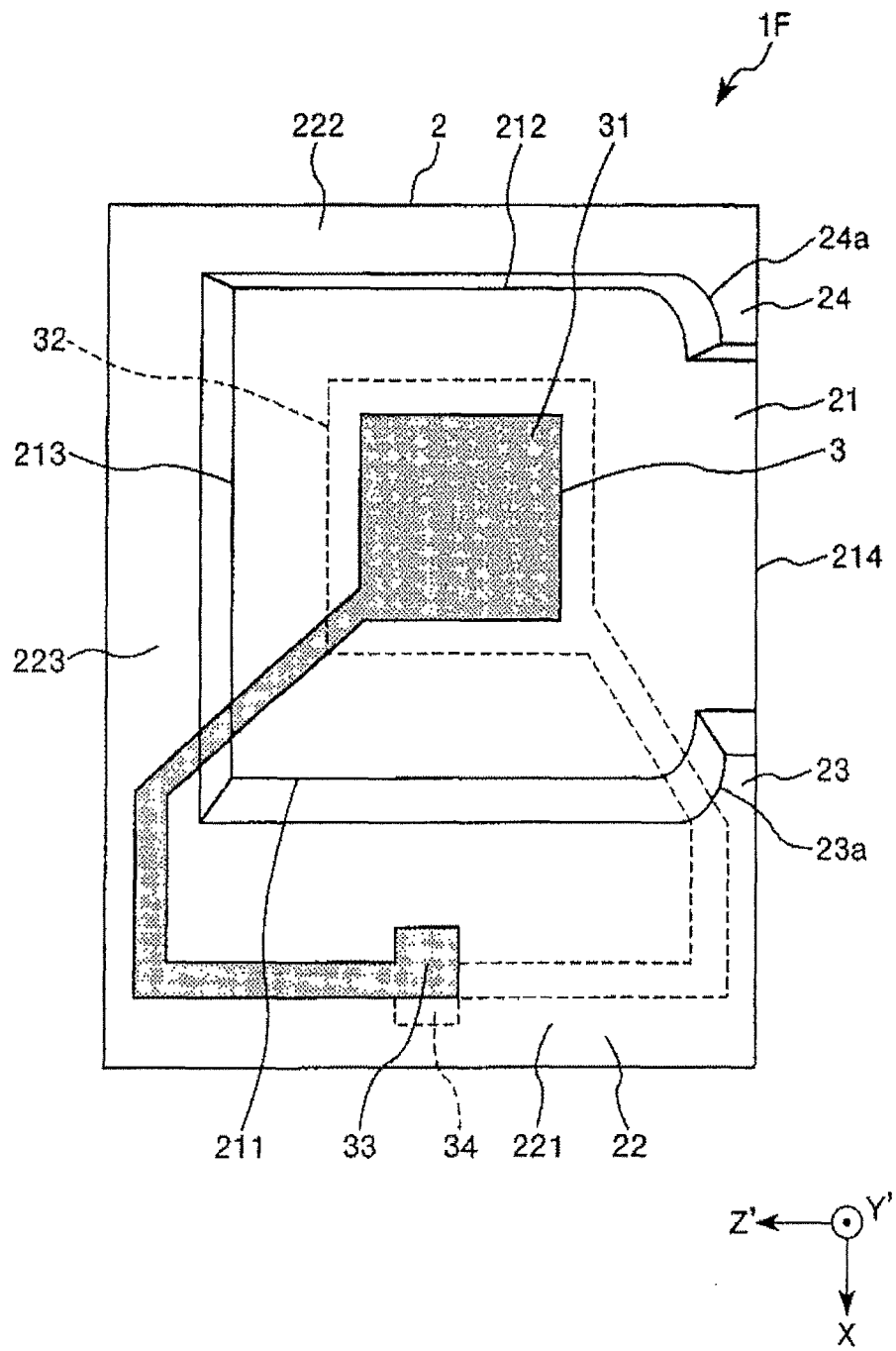
FIG. 9 is a plan view of a resonator element according to a seventh embodiment of the invention.

FIG. 9 is a plan view of a resonator element according to the seventh embodiment of the invention.

Hereinafter, the resonator element according to the seventh embodiment will be described mainly based on a difference from the above-described first embodiment, and description of the same content will not be repeated.

The resonator element according to the seventh embodiment of the invention is the same as the resonator element according to the first embodiment except that the first and second beam portions have a different shape. In addition, the same constituent elements as the ones in the first embodiment are given the same reference numerals.

In the resonator element 1F illustrated in FIG. 9, the first and second beam portions 23 and 24 have a tapered shape whose width is gradually reduced toward the front ends of the first and second beam portions 23 and 24. The outer edges (the outer edges on opposite sides to the third thick section 223) of the outsides of the first and second beam portions 23 and 24 are formed in a straight line extending in the X axis direction in a plan view, and tilt edge parts 23a and 24a (outer edges of the insides thereof) are formed in a curved line which is depressed toward the center of the vibration portion 21. As mentioned above, the first and second beam portions 23 and 24 have a tapered shape, and thus the first and second beam portions 23 and 24 can be made to more consecutively extend from the thick portion 22, for example, than in the resonator element 1 of the first embodiment. For this reason, it is possible to reduce stress concentration on the vicinities of boundaries between the first and second beam portions 23 and 24 and the thick portion 22 in the vibration portion 21. As a result, it is possible to more effectively minimize the nonuniformity of the stress distribution of the vibration portion 21.

The seventh embodiment can also exhibit the same effects as the first embodiment.

Eighth Embodiment

Next, a resonator element according to an eighth embodiment of the invention will be described.

Figure 10:
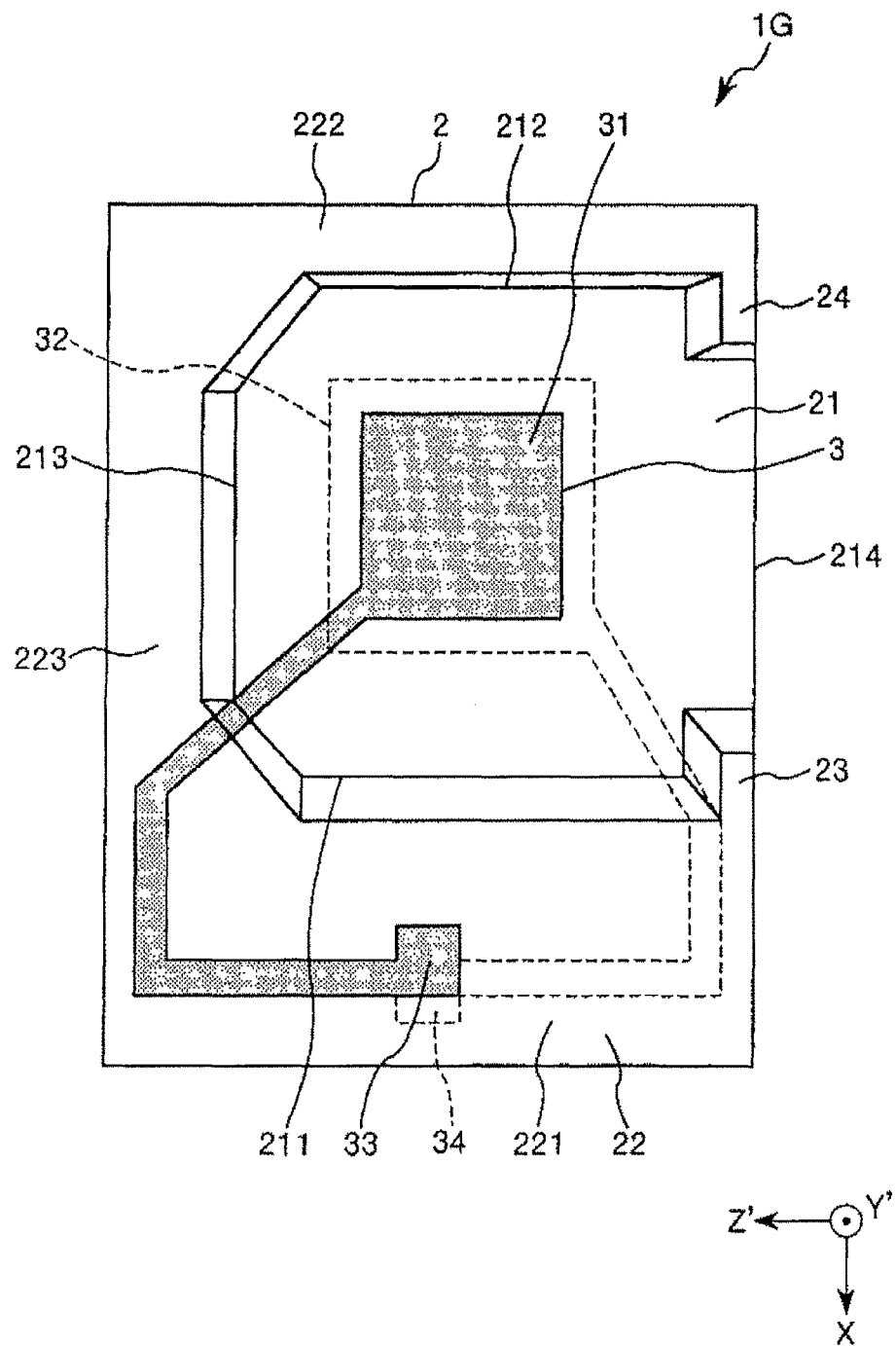
FIG. 10 is a plan view of a resonator element according to an eighth embodiment of the invention.

FIG. 10 is a plan view of a resonator element according to the eighth embodiment of the invention.

Hereinafter, the resonator element according to the eighth embodiment will be described mainly based on a difference from the above-described first embodiment, and description of the same content will not be repeated.

The resonator element according to the eighth embodiment of the invention is the same as the resonator element according to the first embodiment except that the third side has a different shape. In addition, the same constituent elements as the ones in the first embodiment are given the same reference numerals.

In the resonator element 1G illustrated in FIG. 10, the third side 213 of the vibration portion 21 is curved at opposite ends thereof in the −Z' axis direction. For this reason, angles of connection parts between the third side 213 and the first and second sides 211 and 212 are 90° or less. Accordingly, the third side 213 and the first side 211, and the third side 213 and the second side 212 can be made to be more consecutively connected, for example, than in the resonator element 1 of the first embodiment. For this reason, it is possible to reduce stress concentration on the vicinities of boundaries between the third side 213 and the first and second sides 211 and 212 in the vibration portion 21. As a result, it is possible to more effectively minimize the nonuniformity of the stress distribution of the vibration portion 21.

The eighth embodiment can also exhibit the same effects as the first embodiment.

Ninth Embodiment

Next, a resonator element according to a ninth embodiment of the invention will be described.

Figure 11:
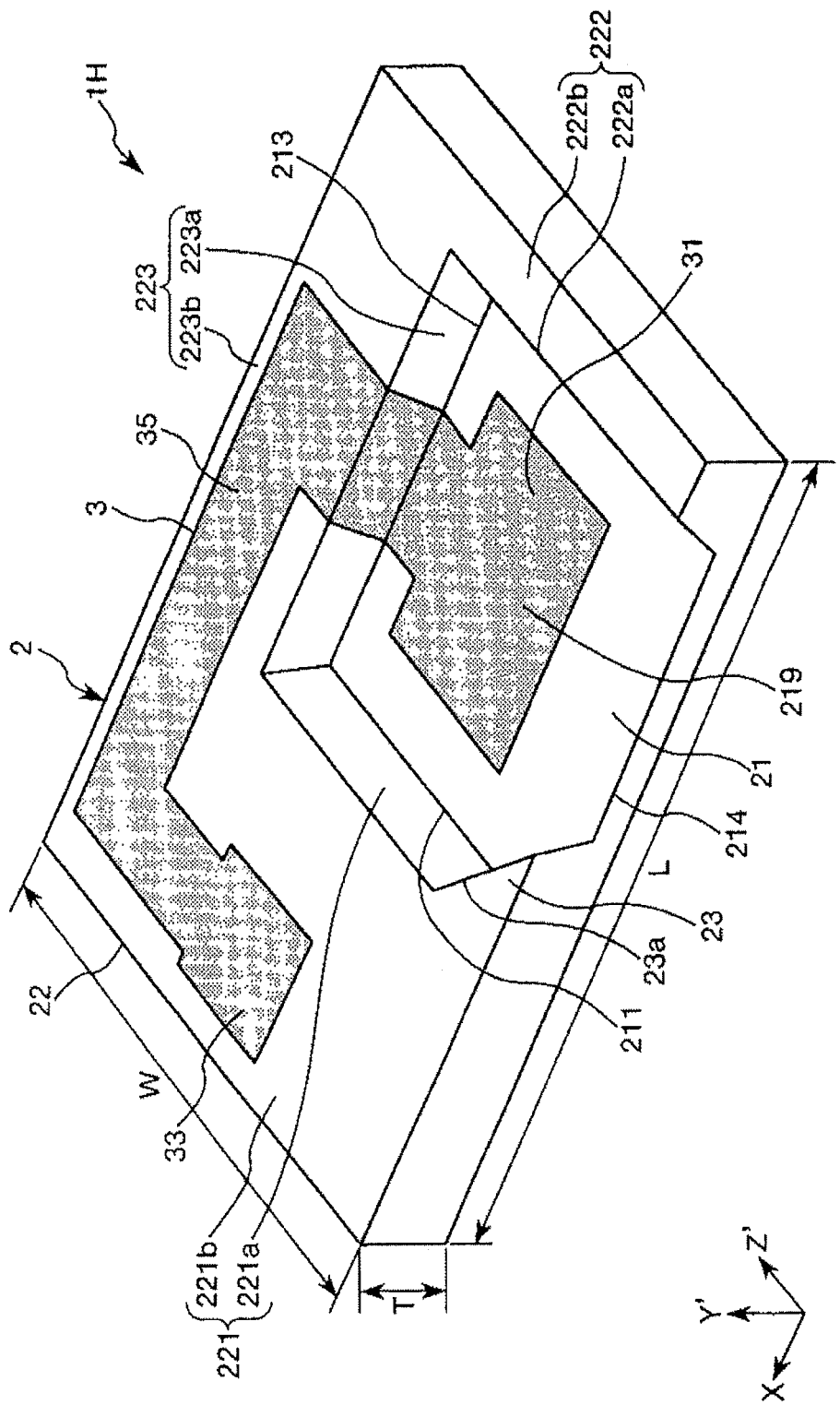
FIG. 11 is a perspective view of a resonator element according to a ninth embodiment of the invention.
Figure 12:
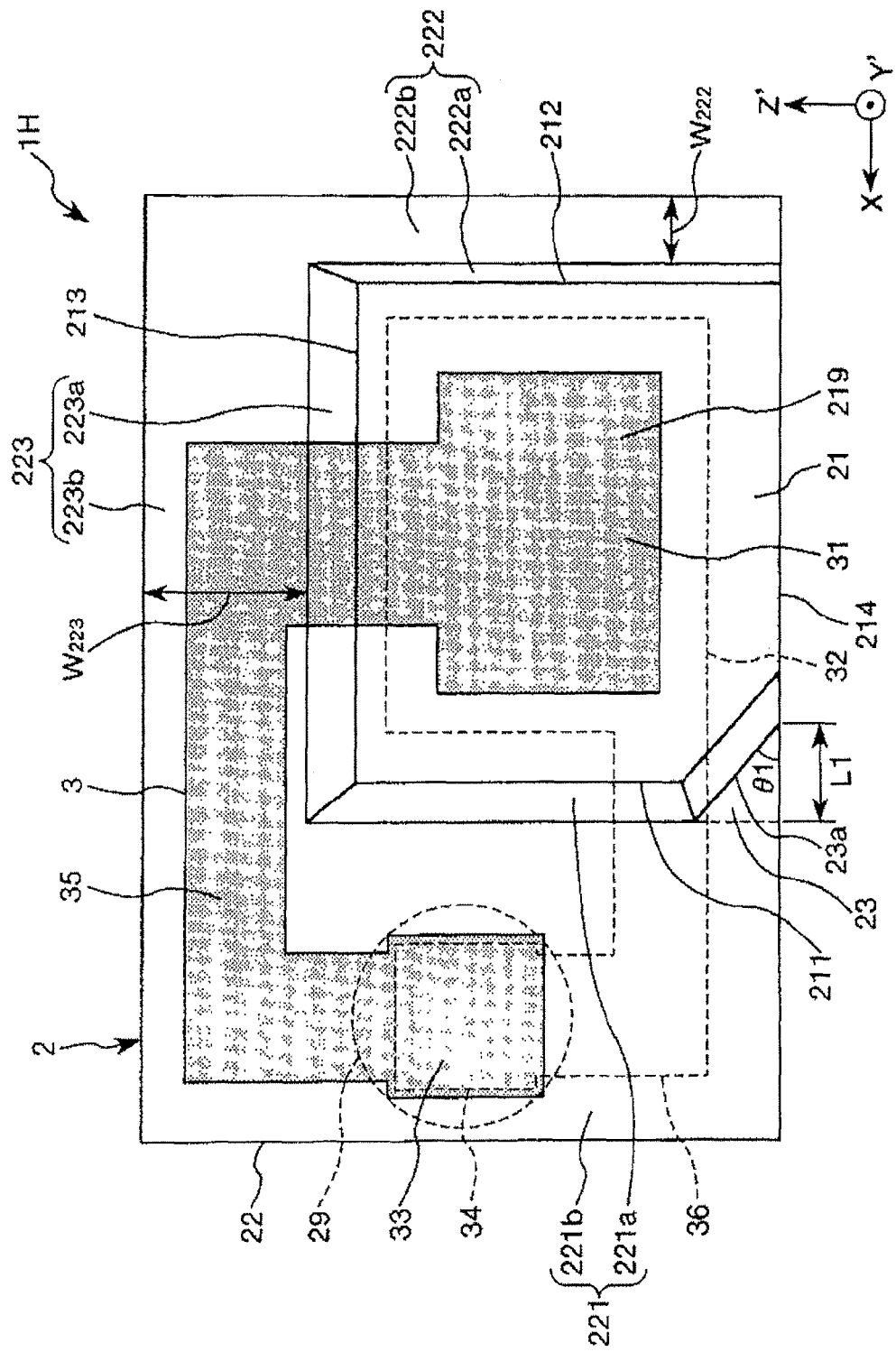
FIG. 12 is a plan view of the resonator element illustrated in FIG. 11.
Figure 13:
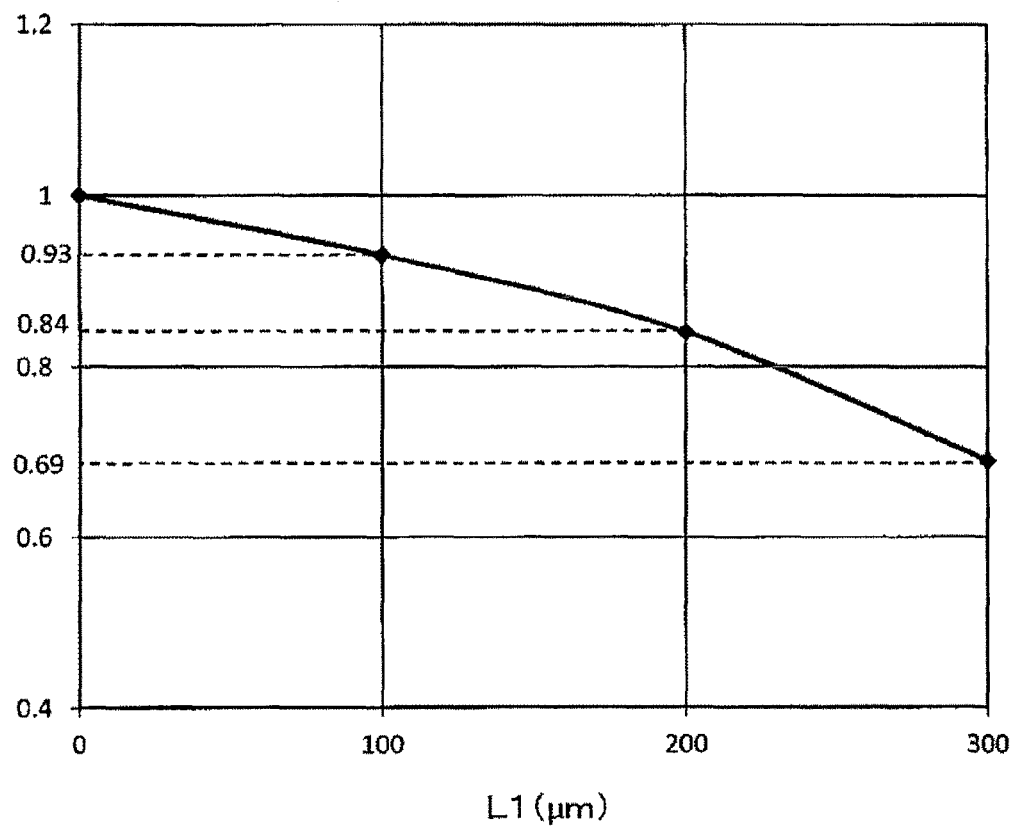
FIG. 13 is a graph illustrating a relationship between a size of a first beam portion and a G sensitivity.
Figure 14:
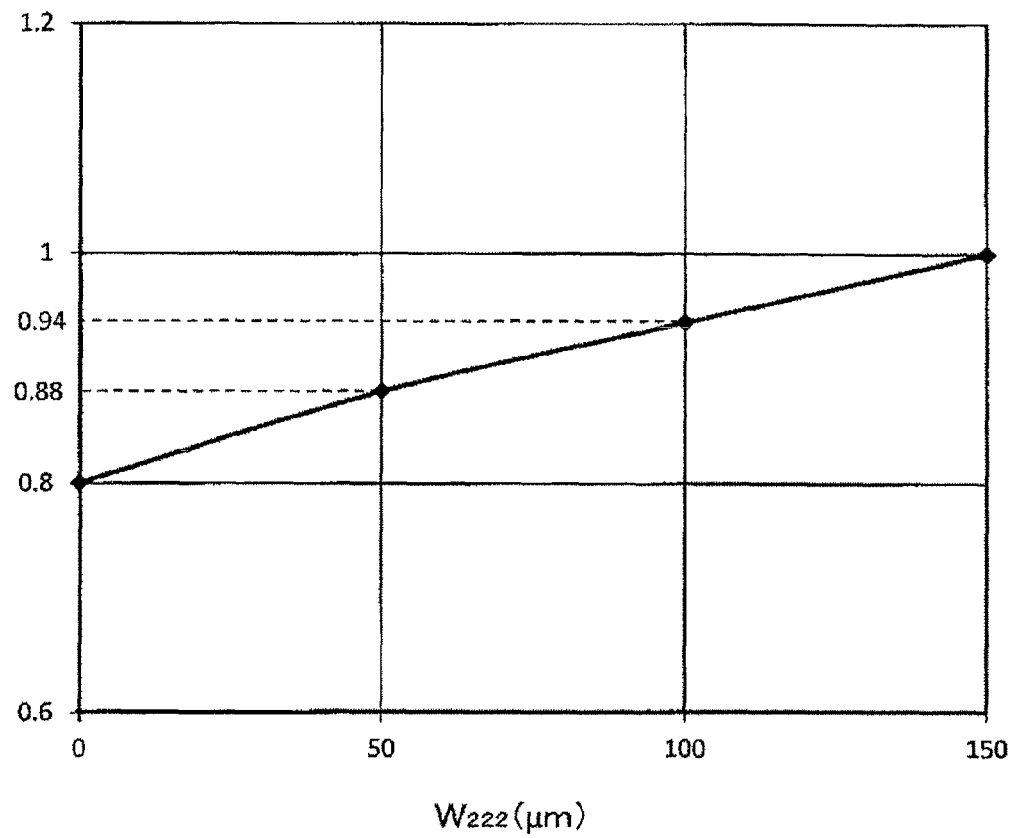
FIG. 14 is a graph illustrating a relationship between a width of a second thick section and the G sensitivity.
Figure 15:
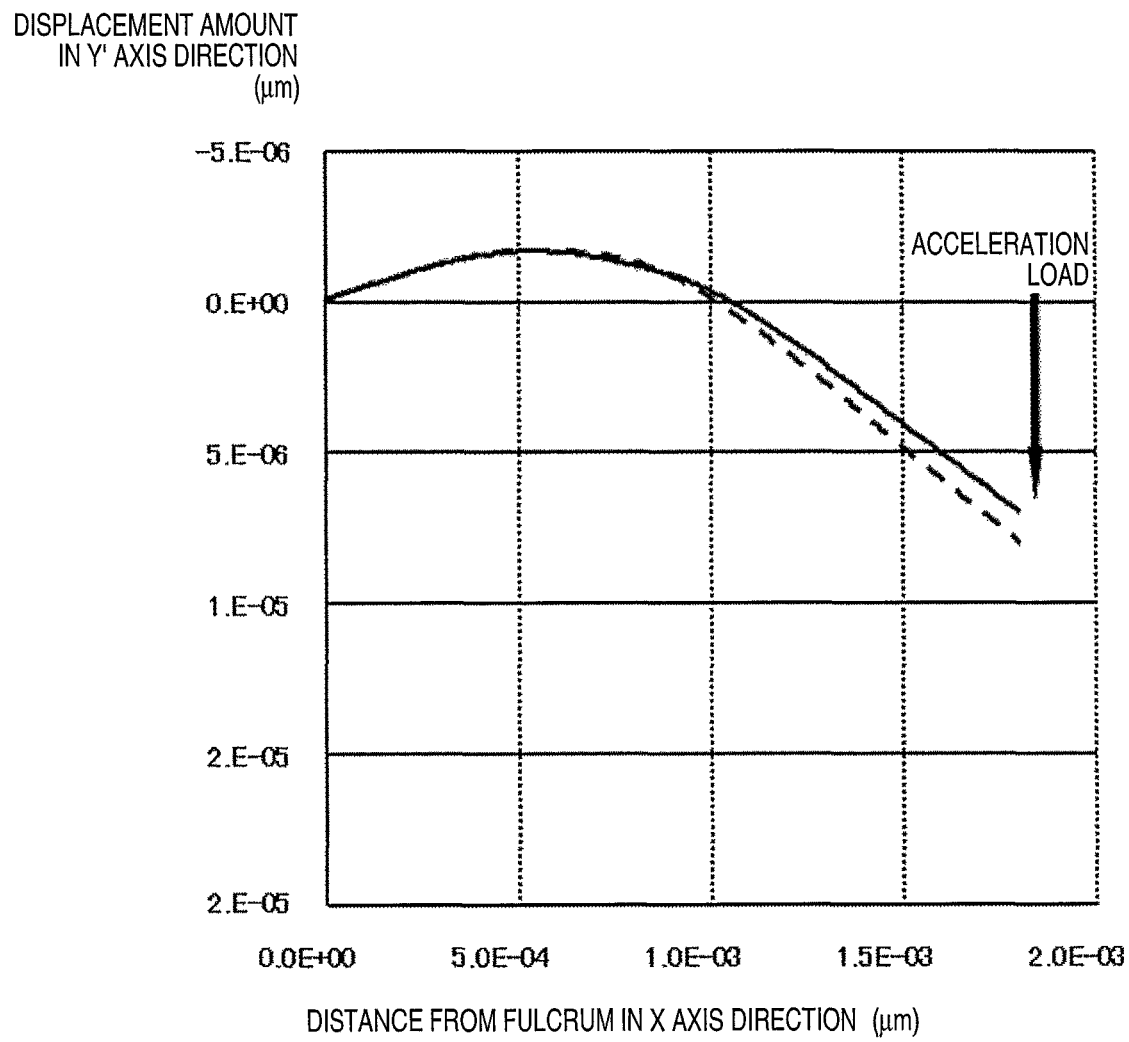
FIG. 15 is a graph illustrating a relationship between a width of the second thick section and a deflection amount.
Figure 16:
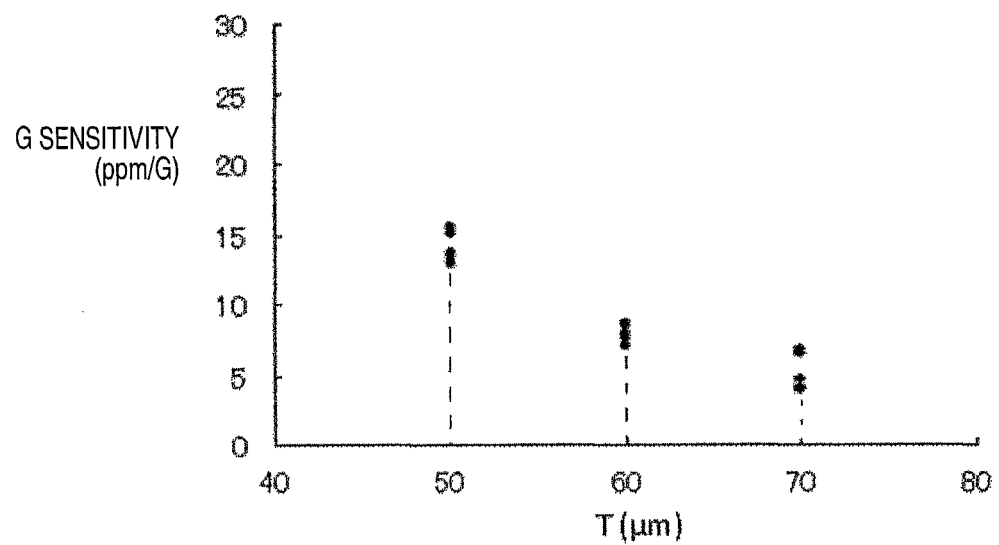
FIG. 16 is a graph illustrating a relationship between a thickness of a thick portion and the G sensitivity.
Figure 17:
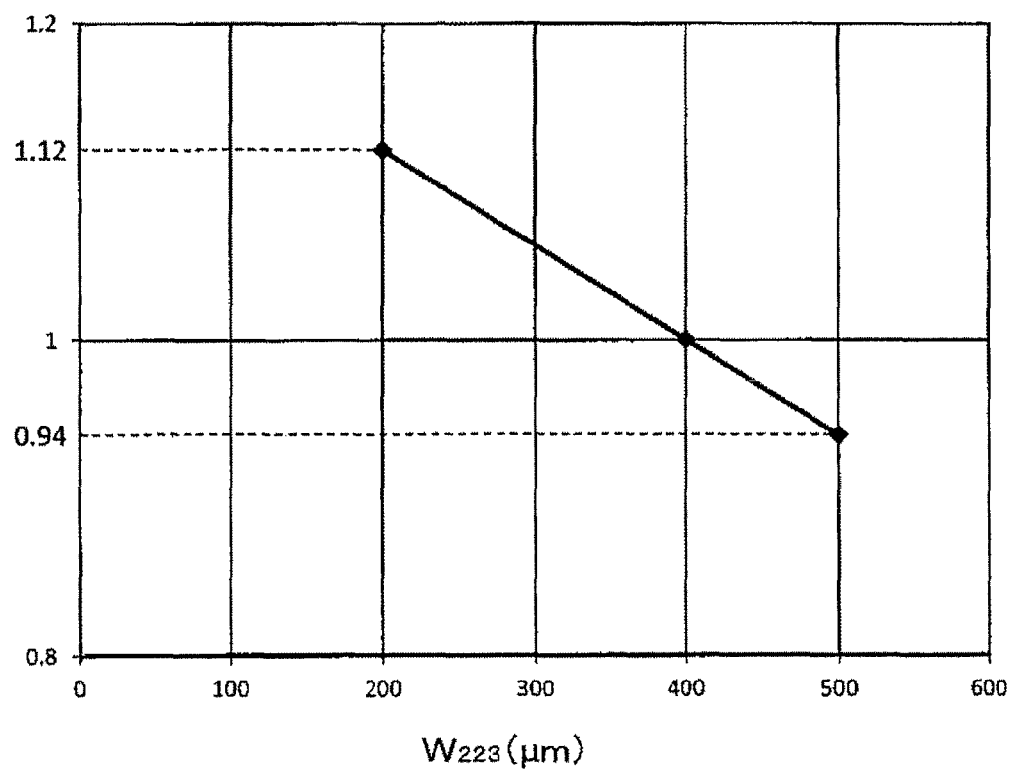
FIG. 17 is a graph illustrating a relationship between a width of a third thick section and the G sensitivity.
Figure 18:
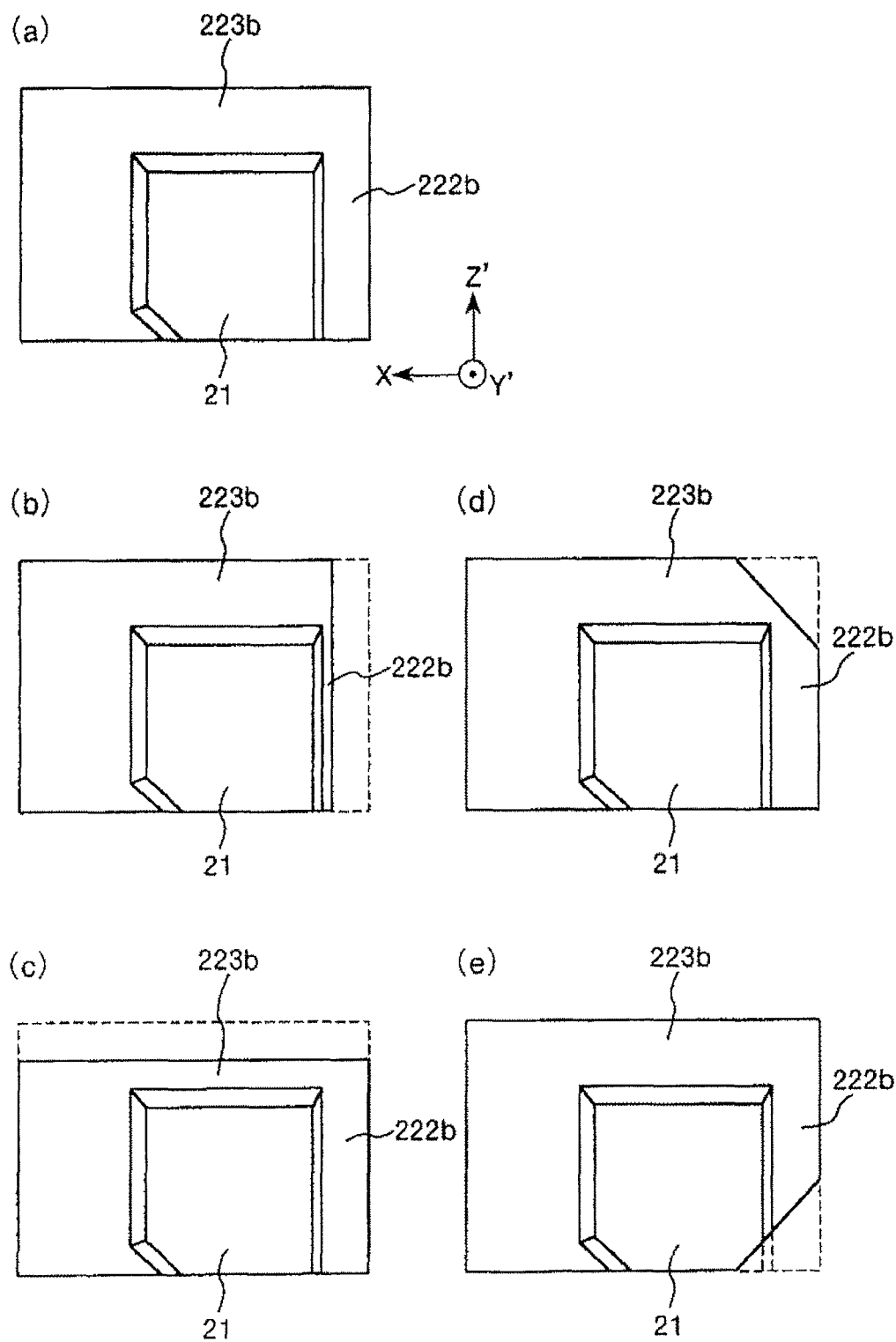
FIGS. 18A to 18E are diagrams illustrating patterns for reducing mass of a front end part of a resonator element.
Figure 19:
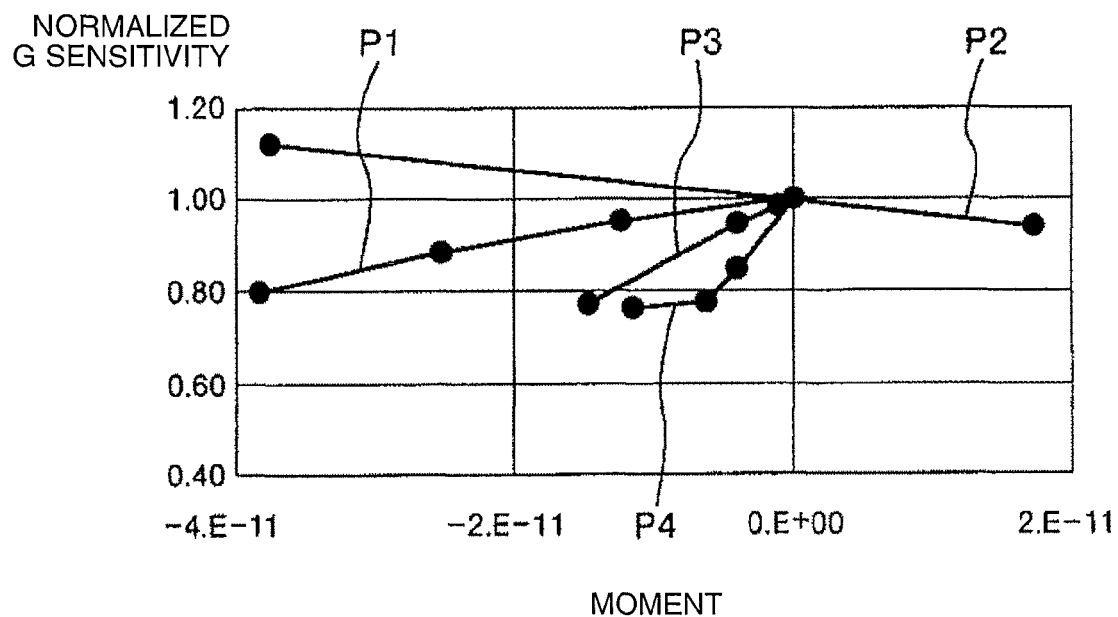
FIG. 19 is a graph illustrating a relationship between moment of the removed part of each pattern illustrated in FIGS. 18A to 18E and the G sensitivity.
Figure 20:
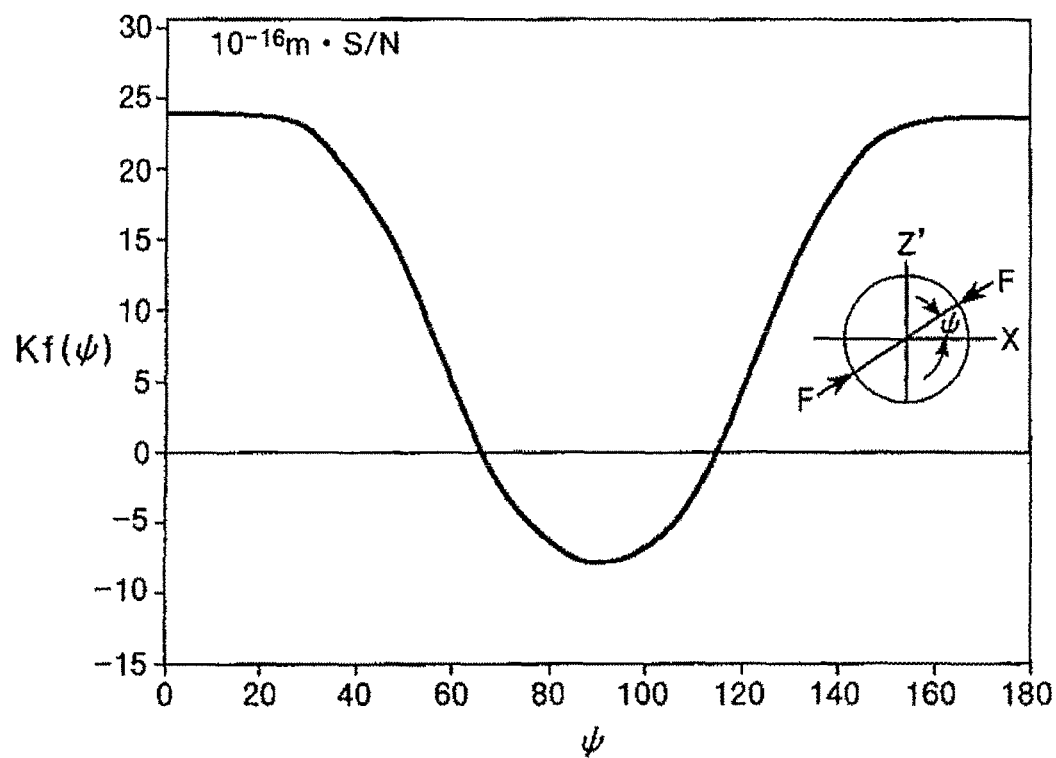
FIG. 20 is a graph illustrating a relationship between crystal axes of quartz crystal and a stress sensitivity.

FIG. 11 is a perspective view of a resonator element according to the ninth embodiment of the invention. FIG. 12 is a plan view of the resonator element illustrated in FIG. 11. FIG. 13 is a graph illustrating a relationship between a size of the first beam portion and a G sensitivity. FIG. 14 is a graph illustrating a relationship between a width of the second thick section and the G sensitivity. FIG. 15 is a graph illustrating a relationship between a width of the second thick section and a deflection amount. FIG. 16 is a graph illustrating a relationship between a thickness of the thick portion and the G sensitivity. FIG. 17 is a graph illustrating a relationship between a width of the third thick section and the G sensitivity. FIGS. 18A to 18E are diagrams illustrating patterns for reducing mass of a front end part of the resonator element. FIG. 19 is a graph illustrating a relationship between moment of the removed part of each pattern illustrated in FIGS. 18A to 18E and the G sensitivity. FIG. 20 is a graph illustrating a relationship between crystal axes of quartz crystal and a stress sensitivity.

Hereinafter, the resonator element according to the ninth embodiment will be described mainly based on a difference from the above-described first embodiment, and description of the same content will not be repeated.

The resonator element according to the ninth embodiment of the invention is the same as the resonator element according to the first embodiment except that the piezoelectric substrate has a different shape. In addition, the same constituent elements as the ones in the first embodiment are given the same reference numerals.

Hereinafter, the resonator element 1H of the present embodiment will be described, and sizes of respective parts described below have especially effective values in a case where an exterior (a length L and a width W) of the resonator element 1H is in a predetermined range. This predetermined range indicates a range which satisfies a relationship of L≤5 mm, and satisfies a relationship of W≤3 mm.

In the resonator element 1H illustrated in FIG. 11, the first beam portion 23 has a tapered shape which is gradually reduced toward the front end. The first beam portion 23 has a tilt edge part 23a which is tilted with respect to both of the X axis direction and the Z' axis direction in a plan view and extends toward the front end side (second side 212 side). The tilt edge part 23a is formed in a straight line and extends to the fourth side 214. Therefore, the first beam portion 23 has a substantially triangular shape in a plan view. An upper limit of a length L1 of the first beam portion 23 is not particularly limited, but may be, for example, a half of the entire length L of the vibration portion 21. In addition, a tilt angle θ1 of the tilt edge part 23a relative to the X axis is different depending on a length L1 of the first beam portion 23, but is preferably 30° or more and 60° or less, and, more preferably nearly 45°. Accordingly, it is possible to sufficiently exhibit the above-described effects and also to reduce stress concentration on the vicinity of the tilt edge part 23a. In the present embodiment, the tilt angle θ1 is nearly 45°.

Here, FIG. 13 is a graph illustrating a variation in a G sensitivity characteristic (normalized G sensitivity) depending on a difference in a size of the first beam portion (tilt edge part 23a) when acceleration is applied in the Y' axis direction. In addition, in FIG. 13, the length L1 illustrated in FIG. 12 is used as a size of the first beam portion 23. Further, the normalized G sensitivity may be expressed by the following expression, and indicates that sensitivity to acceleration in the Y' axis direction is lowered relative to a comparative example as the normalized G sensitivity becomes smaller (this is also the same for the following). A structure (L1=0) in which the beam portion is not provided as illustrated in FIG. 18A is used as the comparative example.

$$G \text{ sensitivity(ppm)} = (\text{frequency during vibration} - \text{frequency when stopped})/(\text{frequency when stopped}) \times 10^6 \quad (1)$$

$$\text{Normalized } G \text{ sensitivity} = (G \text{ sensitivity of the invention})/(G \text{ sensitivity in the comparative example}) \quad (2)$$

It can be seen from FIG. 13 that, as the first beam portion 23 increases in a size, a frequency variation is reduced, and thus a sensitivity to acceleration in the Y' axis direction is lowered. In addition, FIG. 13 is a graph showing a tendency of the resonator element 1H as an example, and the resonator element 1H is not limited to the numerical values of FIG. 13.

Next, a thickness (an average length in the Y' axis direction) T of the thick portion 22 of the resonator element 1H, a width (an average length in the X axis direction) $W_{222}$ of the second thick section 222, and a width (an average length in the Z' axis direction) $W_{223}$ of the third thick section 223 will be described in detail, respectively. In addition, the thickness T indicates an average thickness of the thick portion main bodies 221b, 222b and 223b of the thick portion 22; the width $W_{222}$ indicates an average width of the thick portion main body 222b; and the width $W_{223}$ indicates an average width of the thick portion main body 223b.

First, the width $W_{222}$ of the thick portion main body 222b will be described. The width $W_{222}$ is not particularly limited, but is preferably 100 μm or less. Accordingly, mass of the second thick section 222 can be sufficiently reduced, and thus mass on the front end side of the resonator element 1H can be decreased. For this reason, it is possible to minimize a variation in a vibration characteristic caused by acceleration in the Y' axis direction, and thus to provide the resonator element 1H showing a stable vibration characteristic regardless of whether or not the acceleration is applied in the Y' axis direction.

FIG. 14 is a graph illustrating a variation in a G sensitivity characteristic (normalized G sensitivity) depending on a difference in the width $W_{222}$ when acceleration in the Y' axis direction is applied. It can be seen from FIG. 14 that, as the width $W_{222}$ becomes smaller, a frequency variation is reduced, and thus a sensitivity to acceleration in the Y' axis direction is lowered. In addition, FIG. 15 illustrates a difference between deflection amounts of two resonator elements with different widths $W_{222}$ when an acceleration load in the −Y' axis direction is applied. In FIG. 15, the width $W_{222}$ of the resonator element indicated by the solid line is set to be smaller than the width $W_{222}$ of the resonator element indicated by the chain line. In addition, the resonator element indicated by the solid line has a smaller deflection amount. For this reason, it can be seen that the smaller the width $W_{222}$ is, the lower the sensitivity of the resonator element 1H to acceleration in the Y' axis direction is. FIGS. 14 and 15 are graphs showing a tendency of the resonator element 1H as an example, and the resonator element 1H is not limited to the numerical values of FIGS. 14 and 15.

Here, from the viewpoint of an effect of reducing mass of the front end part of the resonator element 1H, the width $W_{222}$ preferably becomes smaller, but if the width $W_{222}$ is too small, there is a concern that the strength of the resonator element 1H may be excessively reduced depending on a thickness T of the thick portion 22, and thus the resonator element 1H may be damaged. For this reason, the width $W_{222}$ is preferably 40 μm or more from the viewpoint of ensuring the mechanical strength of the resonator element 1H. In other words, if a relationship of 40 μm ≤ $W_{222}$ ≤ 100 μm is satisfied, it is possible to reduce mass of the front end part of the resonator element 1H while ensuring the mechanical strength of the resonator element 1H. Accordingly, it is possible to further reduce a deflection amount of the front end side of the resonator element 1H when acceleration in the Y' axis direction is applied to the resonator element 1H. For this reason, the resonator element 1H can show a more stable vibration characteristic regardless of whether or not the acceleration in the Y' axis direction is applied. In addition, the relationship of 45 μm ≤ $W_{222}$ ≤ 55 μm is satisfied, and thus it is possible to more remarkably exhibit the above-described effects.

Next, the thickness T of the thick portion 22 will be described. The thickness T is not particularly limited, but preferably satisfies a relationship of 50 μm ≤ T ≤ 70 μm. Accordingly, it is possible to form the vibration portion 21 with high accuracy while ensuring the rigidity of the resonator element 1H. For this reason, the resonator element 1H can stably show a desired vibration characteristic. In contrast, if the thickness T is smaller than the lower limit value, there is a case where the rigidity of the resonator element 1H is insufficient depending on mass (a length L, a width W, and the like) of the resonator element 1H, and thus a deflection amount of the front end part (vibration portion 21) of the resonator element 1H cannot be made sufficiently small when acceleration in the Y' axis direction is applied to the resonator element 1H. Conversely, if the thickness T is larger than the upper limit value, there is a concern that the resonator element 1H may excessively increase in a size or a yield of the resonator element 1H may be reduced. Specifically, as described above, the vibration portion 21 is obtained by forming a recessed part on the main surface on the +Y' axis side through wet etching. However, if the thickness T is increased, the recessed part is deepened accordingly, and, as a result, widths of the tilt parts 222a, 223a and 224a are also increased. This leads to an increase in a size of the resonator element 1H. In addition, if the thickness T is increased, a depth (etching depth) of the recessed part is also increased, and thus etching accuracy is reduced. Therefore, it is difficult to set the vibration portion 21 to a desired thickness, and thus a yield of the resonator element 1H is reduced.

FIG. 16 is a graph illustrating a variation in a G sensitivity characteristic (normalized G sensitivity) depending on a difference in the thickness T when acceleration in the Y' axis direction is applied. It can be seen from FIG. 16 that, as the thickness T is increased, a frequency variation is reduced, and thus a sensitivity to acceleration in the Y' axis direction is lowered. FIG. 16 illustrates results of four samples. In addition, FIG. 16 is a graph showing a tendency of the resonator element 1H as an example, and the resonator element 1H is not limited to the numerical values of FIG. 16.

Next, the width $W_{223}$ of the thick portion main body 223b will be described. The width $W_{223}$ is not particularly limited, but is preferably, for example, 200 μm or more. Accordingly, the sufficient rigidity of the resonator element 1H can be ensured, and thus it is possible to reduce a deflection amount of the front end side (vibration portion 21) of the resonator element 1 when acceleration in the Y' axis direction is applied to the resonator element 1H. Therefore, the resonator element 1H can show a stable vibration characteristic regardless of whether or not the acceleration in the Y' axis direction is applied. An upper limit value of the width $W_{223}$ is not particularly limited, and is preferably as great as possible as long as the vibration portion 21 can be formed in a desired size. Accordingly, it is possible to more remarkably exhibit the above-described effects.

FIG. 17 is a graph illustrating a variation in a G sensitivity characteristic (normalized G sensitivity) depending on a difference in the width $W_{223}$ when acceleration in the Y' axis direction is applied. It can be seen from FIG. 17 that, as the width $W_{223}$ is increased, a frequency variation is reduced, and thus a sensitivity to acceleration in the Y' axis direction is lowered. In addition, FIG. 17 is a graph showing a tendency of the resonator element 1H as an example, and the resonator element 1H is not limited to the numerical values of FIG. 17.

As mentioned above, the resonator element 1H of the present embodiment has been described in detail.

Here, in order to reduce mass of the front end part of the resonator element as the comparative example illustrated in FIG. 18A, a width of the thick portion main body 222b may be reduced as illustrated in FIG. 18B; a width of the thick portion main body 223b may be reduced as illustrated in FIG. 18C; a corner of the front end part on the +Z' axis side may be removed as illustrated in FIG. 18D; and a corner of the front end part on the −Z' axis side may be removed as illustrated in FIG. 18E. In addition, hereinafter, the pattern of FIG. 18B is also referred to as a pattern P1; the pattern of FIG. 18C is also referred to as a pattern P2; the pattern of FIG. 18D is also referred to as a pattern P3; and the pattern of FIG. 18E is also referred to as a pattern P4.

FIG. 19 illustrates an influence of each of the patterns P1 to P4 on the G sensitivity characteristic. The transverse axis of the graph of FIG. 19 expresses a value of [mass of a removed part (a part surrounded by the chain line)]×[a distance between a centroid of the removed part and a starting point (mount portion 29)], and this value is hereinafter referred to as "moment". The longitudinal axis of the graph of FIG. 19 expresses a normalized G sensitivity which is a value obtained by normalizing a G sensitivity of each of the patterns P1 to P4 with a G sensitivity of the resonator element which is the comparative example illustrated in FIG. 18A as 1.

It can be seen from FIG. 19 that variations in the G sensitivity characteristics of the patterns P1 to P4 are different from each other. For example, in the patterns P1, P3 and P4, as a size of the removed part is increased, the G sensitivity is reduced. Conversely, in the pattern P2, as a size of the removed part is increased, the G sensitivity is increased. In addition, as for the patterns P1, P3 and P4, in the patterns P1 and P3, the G sensitivity is linearly reduced without saturation in proportion to a size of the removed part, but, in the pattern P4, the reduction in the G sensitivity is substantially saturated if a size of the removed part is equal to or larger than a specific value. This difference between the G sensitivity characteristic variations of the respective patterns P1 to P4 is considered to be caused by the crystal axes of quartz crystal and a shape of the resonator element.

FIG. 20 is a graph illustrating a relationship with a displacement of a resonance frequency due to a force F applied to a quartz crystal resonator. When an intersection angle between the force F and the X axis of the quartz crystal is indicated by ψ, the force F acts in the X axis direction at ψ=0°, and the force F acts in the Z' axis direction at ψ=90°.

In addition, as can be seen from FIG. 20, positive and negative signs of stress sensitivities (Kf) of the X axis and the Z' axis are reversed. This is considered to serve as one factor so as to cause the difference between the pattern P1 and the pattern P2. In addition, it is considered that the patterns P3 and P4 are considered to be a complex of the patterns P1 and P2, and thus show characteristics different from characteristics of the patterns P1 and P2. Further, it is considered that the difference between the patterns P3 and P4 is also caused by a difference in a shape of the resonator element, in addition to the stress sensitivity. In other words, in the pattern P3, the thick portion 22 takes up the entire removed part regardless of a size of the removed part, and thus the G sensitivity is linearly lowered with respect to the size of the removed part. On the other hand, in the pattern P4, as a size of the removed part is increased, a proportion of the vibration portion 21 taking up the removed part is also increased. Therefore, a mass reduction effect deteriorates, and thus the reduction in the G sensitivity is saturated.

As mentioned above, the present inventors have found that a method of varying the G sensitivity can be selected on the basis of a method of reducing mass of the front end part of the resonator element. In the resonator element 1H, the pattern P1 is selected among the patterns P1 to P4, so as to reduce mass of the front end part, thereby improving the G sensitivity characteristic. The pattern P1 is preferable in that the reduction in the G sensitivity is exhibited without being saturated. In addition, the pattern P1 is also effective in that a length of the resonator element 1H in the X axis direction is made shorter than the other patterns P2 to P4, thereby achieving miniaturization. As described above, by increasing the width $W_{223}$, it is possible to prevent exhibition of an effect of the pattern P2, and thus an increase in the G sensitivity can be minimized.

The ninth embodiment can also exhibit the same effects as the first embodiment.

Tenth Embodiment

Next, a resonator element according to a tenth embodiment of the invention will be described.

Figure 21:
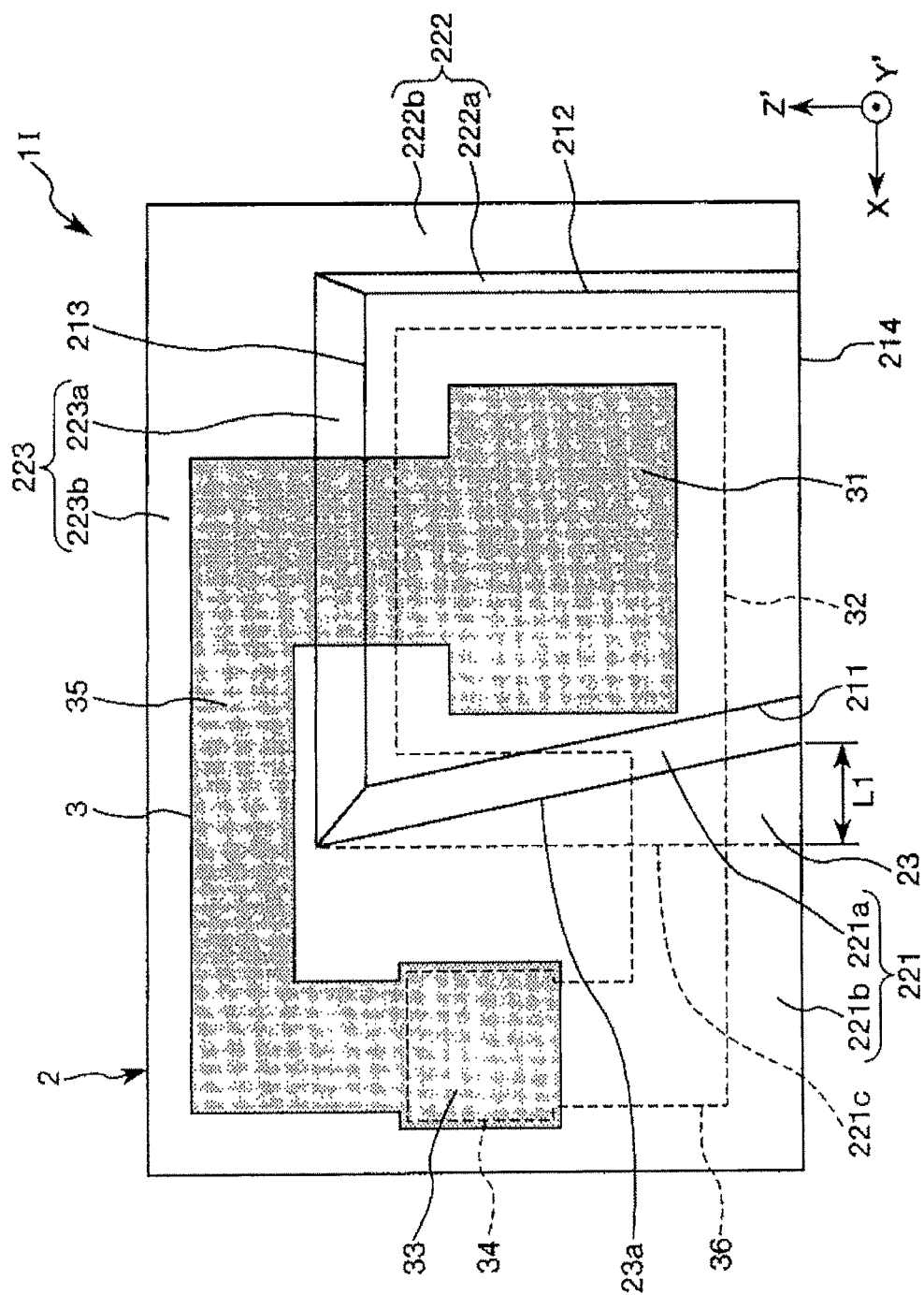
FIG. 21 is a plan view of a resonator element according to a tenth embodiment of the invention.
Figure 22:
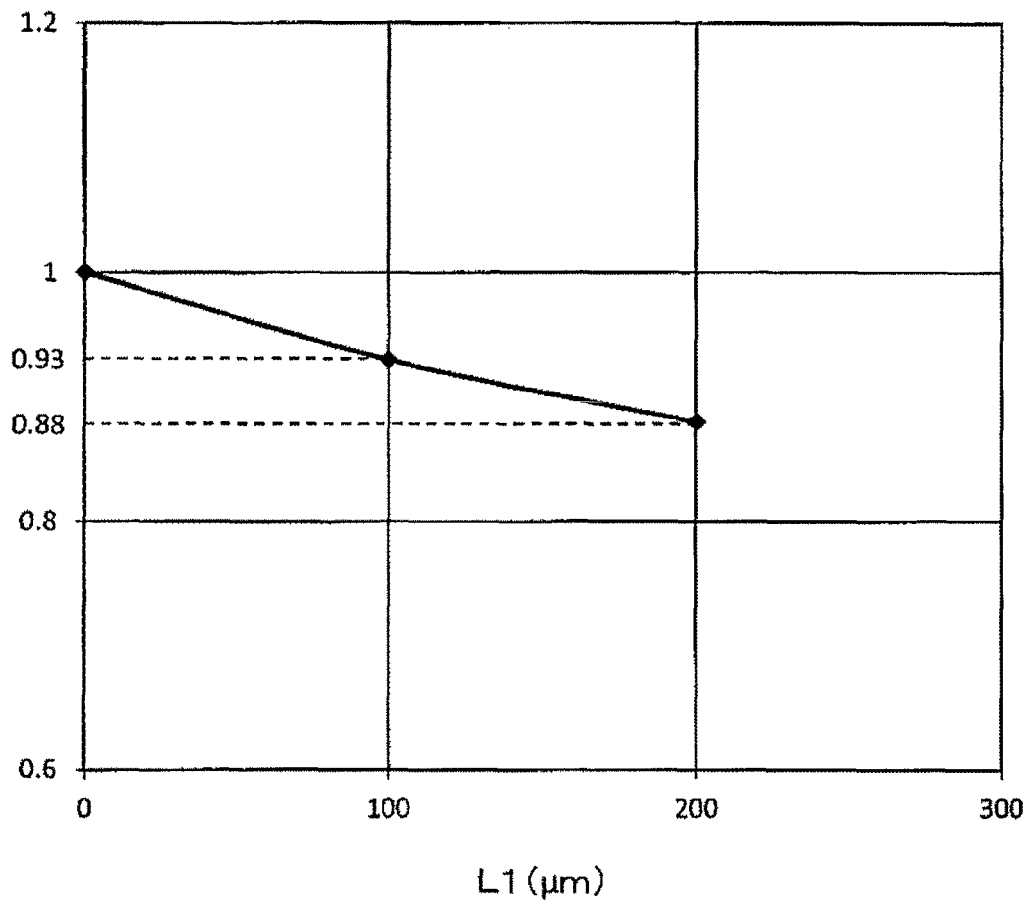
FIG. 22 is a graph illustrating a relationship between a size of the first beam portion and the G sensitivity.

FIG. 21 is a plan view of a resonator element according to the tenth embodiment of the invention. FIG. 22 is a graph illustrating a relationship between a size of the first beam portion and the G sensitivity.

Hereinafter, the resonator element according to the tenth embodiment will be described mainly based on a difference from the above-described ninth embodiment, and description of the same content will not be repeated.

The resonator element according to the tenth embodiment of the invention is the same as the resonator element according to the ninth embodiment except that the first beam portion has a different configuration. In addition, the same constituent elements as the ones in the ninth embodiment are given the same reference numerals.

As illustrated in FIG. 21, in the resonator element 1I of the present embodiment, the first beam portion 23 is provided so as to extend from the entire region of an edge part 221c of the first thick section 221 (thick portion main body 221b) on the vibration portion 21 side. The first beam portion 23 can also exhibit the same effects as the ones in the ninth embodiment. In addition, as compared with the ninth embodiment, it is possible to reduce stress concentration on the vicinity of the tilt edge part 23a of the first beam portion 23.

FIG. 22 is a graph illustrating a variation in a G sensitivity characteristic (normalized G sensitivity) depending on a difference in a size of the first beam portion 23 when acceleration is applied in the Y' axis direction. In addition, in FIG. 22, the length L1 of the first beam portion 23 is used as a size of the first beam portion 23. It can be seen from FIG. 22 that, as the first beam portion 23 increases in a size, a frequency variation is reduced, and thus a sensitivity to acceleration in the Y' axis direction is lowered. In addition, FIG. 22 is a graph showing a tendency of the resonator element 1I as an example, and the resonator element 1I is not limited to the numerical values of FIG. 22.

The tenth embodiment can also exhibit the same effects as the ninth embodiment.

Eleventh Embodiment

Next, a resonator element according to an eleventh embodiment of the invention will be described.

Figure 23:
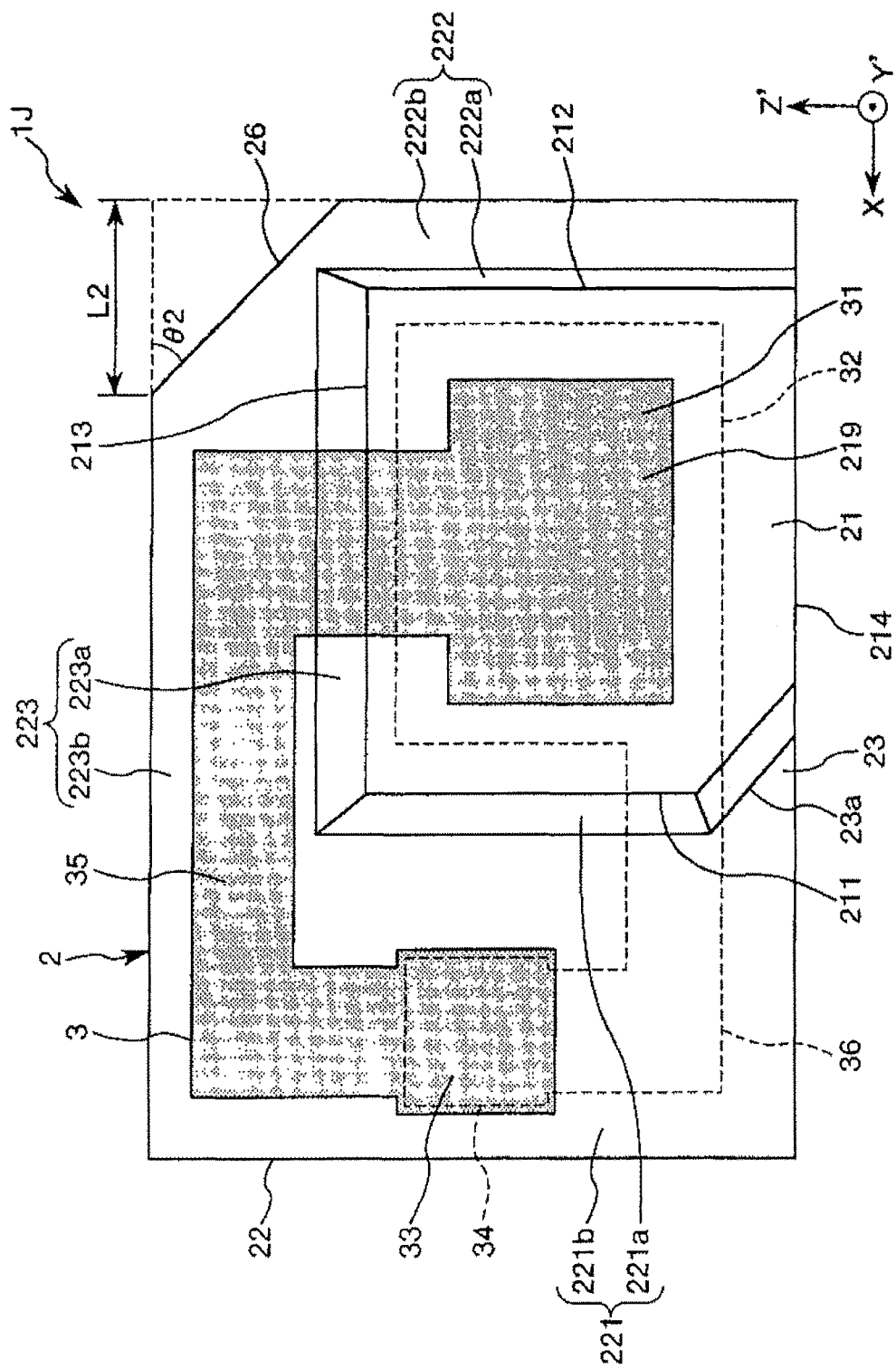
FIG. 23 is a plan view of a resonator element according to an eleventh embodiment of the invention.
Figure 24:
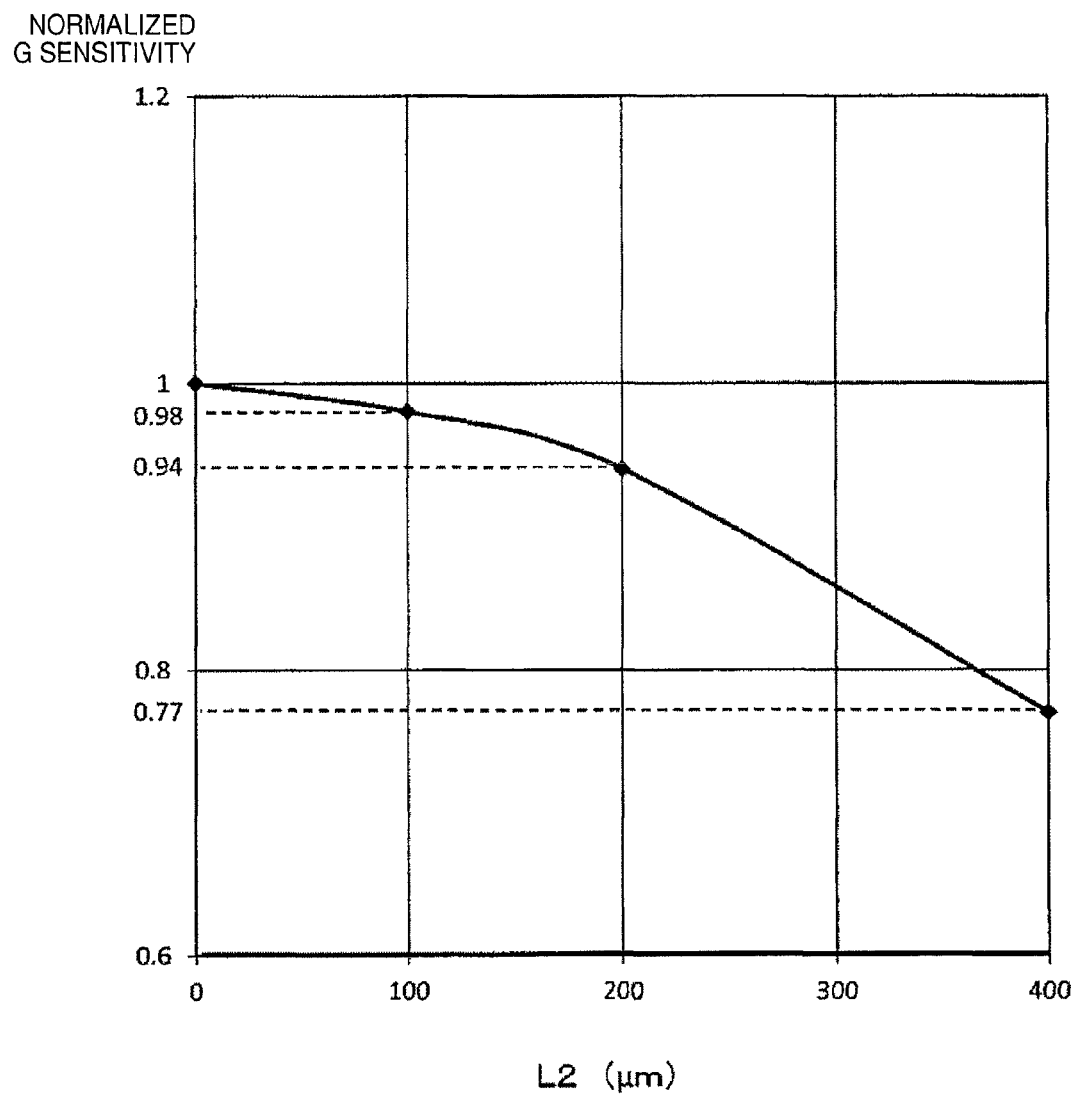
FIG. 24 is a graph illustrating a relationship between a size of a first tilt outer edge part and the G sensitivity.

FIG. 23 is a plan view of a resonator element according to the eleventh embodiment of the invention. FIG. 24 is a graph illustrating a relationship between a size of a first tilt outer edge part and the G sensitivity.

Hereinafter, the resonator element according to the eleventh embodiment will be described mainly based on a difference from the above-described ninth embodiment, and description of the same content will not be repeated.

The resonator element according to the eleventh embodiment of the invention is the same as the resonator element according to the ninth embodiment except that the piezoelectric substrate has a different configuration. In addition, the same constituent elements as the ones in the ninth embodiment are given the same reference numerals.

As illustrated in FIG. 23, in the resonator element 1J of the present embodiment, a first tilt outer edge part 26, which is tilted in both of the X axis direction and the Z' axis direction in a plan view, is provided at a corner where the second thick section 222 is connected to the third thick section 223. The first tilt outer edge part 26 is provided so as to notch the corner which is located on the −X axis side and further on the +Z' axis side. The first tilt outer edge part 26 is provided, and thus it is possible to reduce mass of a front end side of the resonator element 1J. For this reason, it is possible to further lower a sensitivity of the resonator element 1J to acceleration in the Y' axis direction, and thus to provide the resonator element 1J showing a stable vibration characteristic regardless of whether or not the acceleration is applied in the Y' axis direction.

Here, a tilt angle θ2 of the first tilt outer edge part 26 relative to the X axis is not particularly limited, but is preferably 30° or more and 60° or less, and, more preferably nearly 45°. Accordingly, it is possible to more effectively exhibit the mass reduction effect. In the present embodiment, the tilt angle θ2 is nearly 45°.

The first tilt outer edge part 26 is provided so as not to divide the second thick section 222 and the third thick section 223. Accordingly, the rigidity of the resonator element 1J is prevented from being unintentionally reduced. If the second and third thick sections 222 and 223 are divided by the first tilt outer edge part 26, the second thick section 222 mainly functions as an anchor of the front end part, and thus a deflection amount of the vibration portion 21 in the Y' axis direction increases along with the reduction in the rigidity of the resonator element 1J.

FIG. 24 is a graph illustrating a variation in a G sensitivity characteristic (normalized G sensitivity) depending on a difference in a size of the first tilt outer edge part 26 when acceleration is applied in the Y' axis direction. In addition, in FIG. 24, the length L2 illustrated in FIG. 23 is used as a size of the first tilt outer edge part 26. It can be seen from FIG. 24 that, as the first tilt outer edge part 26 increases in a size, a frequency variation is reduced, and thus a sensitivity to acceleration in the Y' axis direction is lowered. In addition, FIG. 24 is a graph showing a tendency of the resonator element 1J as an example, and the resonator element 1J is not limited to the numerical values of FIG. 24.

In the resonator element 1J of the present embodiment, the pattern P3 is selected among the patterns P1 to P4, so as to reduce mass of the front end part, thereby improving the G sensitivity characteristic. As can be seen from FIG. 19, the pattern P3 is preferable in that the G sensitivity is linearly reduced without being saturated. In addition, the pattern P3 can also be said to be advantageous in that a reduction ratio of the G sensitivity is larger, for example, than the pattern P1 which is common in that the G sensitivity is linearly reduced without being saturated. Further, by reducing the width $W_{222}$, the effect of the pattern P1 can also be exhibited along with the effect of the pattern P3.

The eleventh embodiment can also exhibit the same effects as the ninth embodiment.

Twelfth Embodiment

Next, a resonator element according to a twelfth embodiment of the invention will be described.

Figure 25:
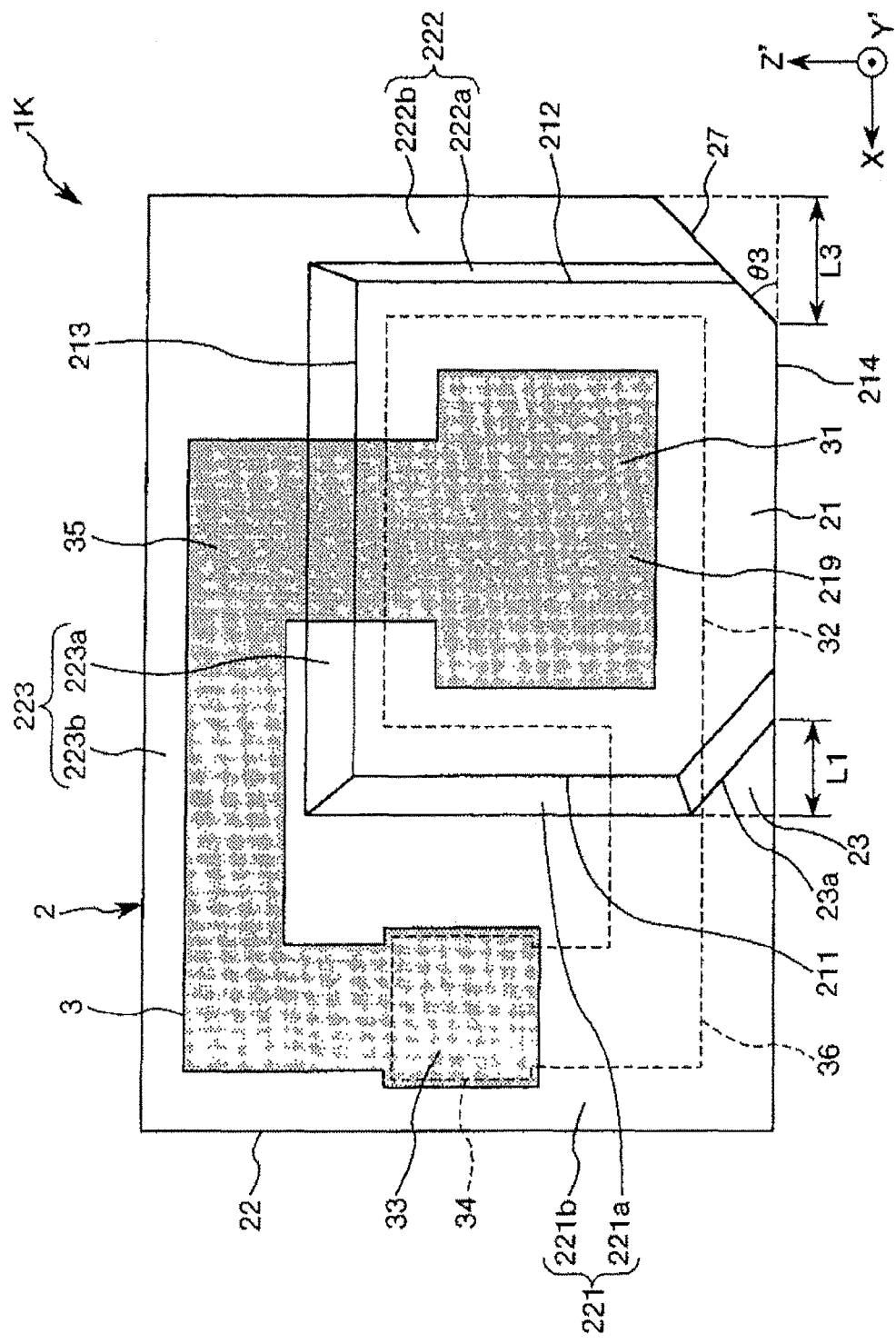
FIG. 25 is a plan view of a resonator element according to a twelfth embodiment of the invention.
Figure 26:
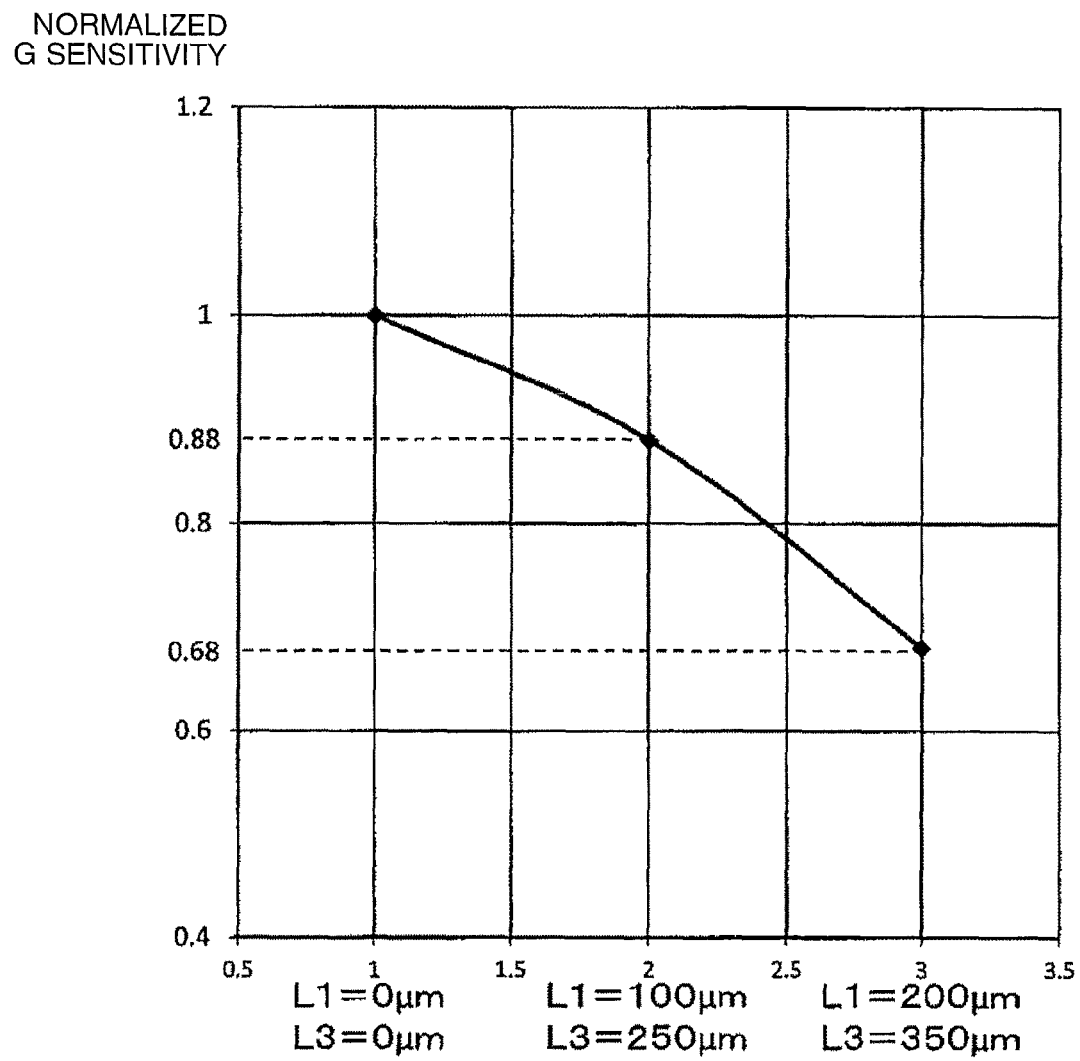
FIG. 26 is a graph illustrating a relationship between a size of a second tilt outer edge part and the G sensitivity.

FIG. 25 is a plan view of a resonator element according to the twelfth embodiment of the invention. FIG. 26 is a graph illustrating a relationship between a size of a second tilt outer edge part and the G sensitivity.

Hereinafter, the resonator element according to the twelfth embodiment will be described mainly based on a difference from the above-described ninth embodiment, and description of the same content will not be repeated.

The resonator element according to the twelfth embodiment of the invention is the same as the resonator element according to the ninth embodiment except that the piezoelectric substrate has a different configuration. In addition, the same constituent elements as the ones in the ninth embodiment are given the same reference numerals.

As illustrated in FIG. 25, in the resonator element 1K of the present embodiment, a second tilt outer edge part 27, which intersects both of the X axis direction and the Z' axis direction in a plan view, is provided at an end of the second thick section 222 on the −Z' axis side. The second tilt outer edge part 27 is provided so as to notch the corner which is located on the −X axis side and further on the −Z' axis side. The second tilt outer edge part 27 is provided, and thus it is possible to reduce mass of a front end side of the resonator element 1K. For this reason, it is possible to further lower a sensitivity of the resonator element 1K to acceleration in the Y' axis direction, and thus to provide the resonator element 1K showing a stable vibration characteristic regardless of whether or not the acceleration is applied in the Y' axis direction.

Here, a tilt angle θ3 of the second tilt outer edge part 27 relative to the X axis is not particularly limited, but is preferably 30° or more and 60° or less, and, more preferably nearly 45°. Accordingly, it is possible to more effectively exhibit the mass reduction effect. In the present embodiment, the tilt angle θ3 is nearly 45°.

The second tilt outer edge part 27 is preferably provided over the vibration portion 21. Accordingly, the second tilt outer edge part 27 can be provided so as to be large, and thus the above-described effects are more remarkably exhibited.

FIG. 26 is a graph illustrating a variation in a G sensitivity characteristic (normalized G sensitivity) depending on differences in sizes of the first beam portion 23 and the second tilt outer edge part 27 when acceleration is applied in the Y' axis direction. In addition, in FIG. 26, the length L1 and the length L3 illustrated in FIG. 25 are respectively used as a size of the first beam portion 23 and a size of the second tilt outer edge part 27. It can be seen from FIG. 26 that, as the first beam portion 23 and the second tilt outer edge part 27 increase in sizes, a frequency variation is reduced, and thus a sensitivity to acceleration in the Y' axis direction is lowered. In addition, FIG. 26 is a graph showing a tendency of the resonator element 1K as an example, and the resonator element 1K is not limited to the numerical values of FIG. 26.

In the resonator element 1K of the present embodiment, the pattern P4 is selected among the patterns P1 to P4, so as to reduce mass of the front end part, thereby improving the G sensitivity characteristic. As can be seen from FIG. 19, the pattern P4 has the largest initial G sensitivity reduction effect among the patterns P1 to P4. For this reason, by selecting the pattern P4, it is possible to more effectively lower a sensitivity of the resonator element 1K to acceleration in the Y' axis direction. Therefore, it is possible to provide the resonator element 1K showing a stable vibration characteristic regardless of whether or not the acceleration is applied in the Y' axis direction.

The twelfth embodiment can also exhibit the same effects as the first embodiment.

Thirteenth Embodiment

Next, a resonator element according to a thirteenth embodiment of the invention will be described.

Figure 27:
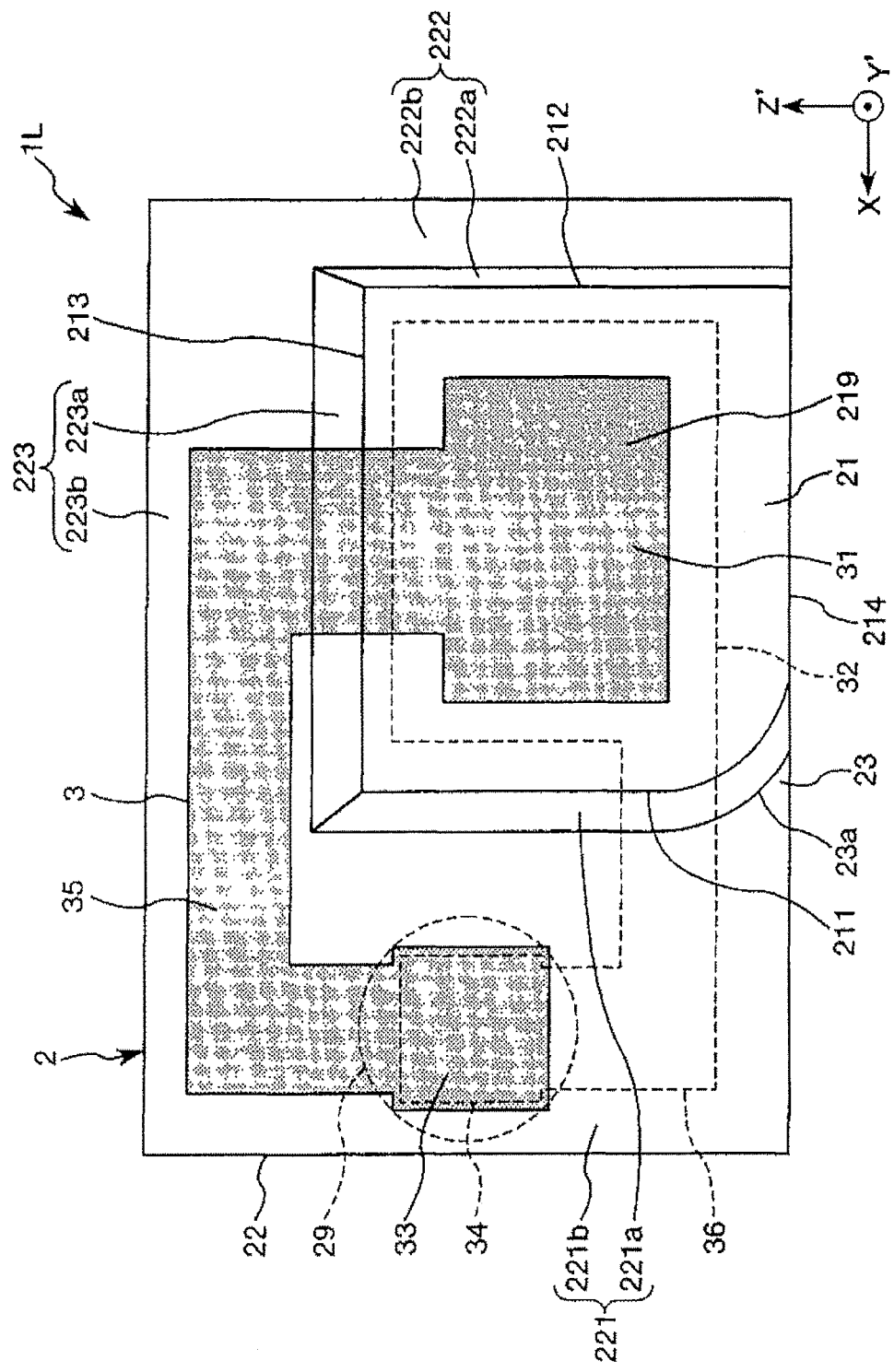
FIG. 27 is a plan view of a resonator element according to a thirteenth embodiment of the invention.

FIG. 27 is a plan view of a resonator element according to the thirteenth embodiment of the invention.

Hereinafter, the resonator element according to the thirteenth embodiment will be described mainly based on a difference from the above-described ninth embodiment, and description of the same content will not be repeated.

The resonator element according to the thirteenth embodiment of the invention is the same as the resonator element according to the ninth embodiment except that the piezoelectric substrate has a different configuration. In addition, the same constituent elements as the ones in the ninth embodiment are given the same reference numerals.

As illustrated in FIG. 27, in the resonator element 1L of the present embodiment, the tilt edge part 23a of the first beam portion 23 is curved so as to be depressed on the vibration portion 21 side. Accordingly, it is possible to more effectively reduce stress concentration on the vicinity of the tilt edge part 23a than in the ninth embodiment.

The thirteenth embodiment can also exhibit the same effects as the ninth embodiment.

Fourteenth Embodiment

Next, a resonator element according to a fourteenth embodiment of the invention will be described.

Figure 28:
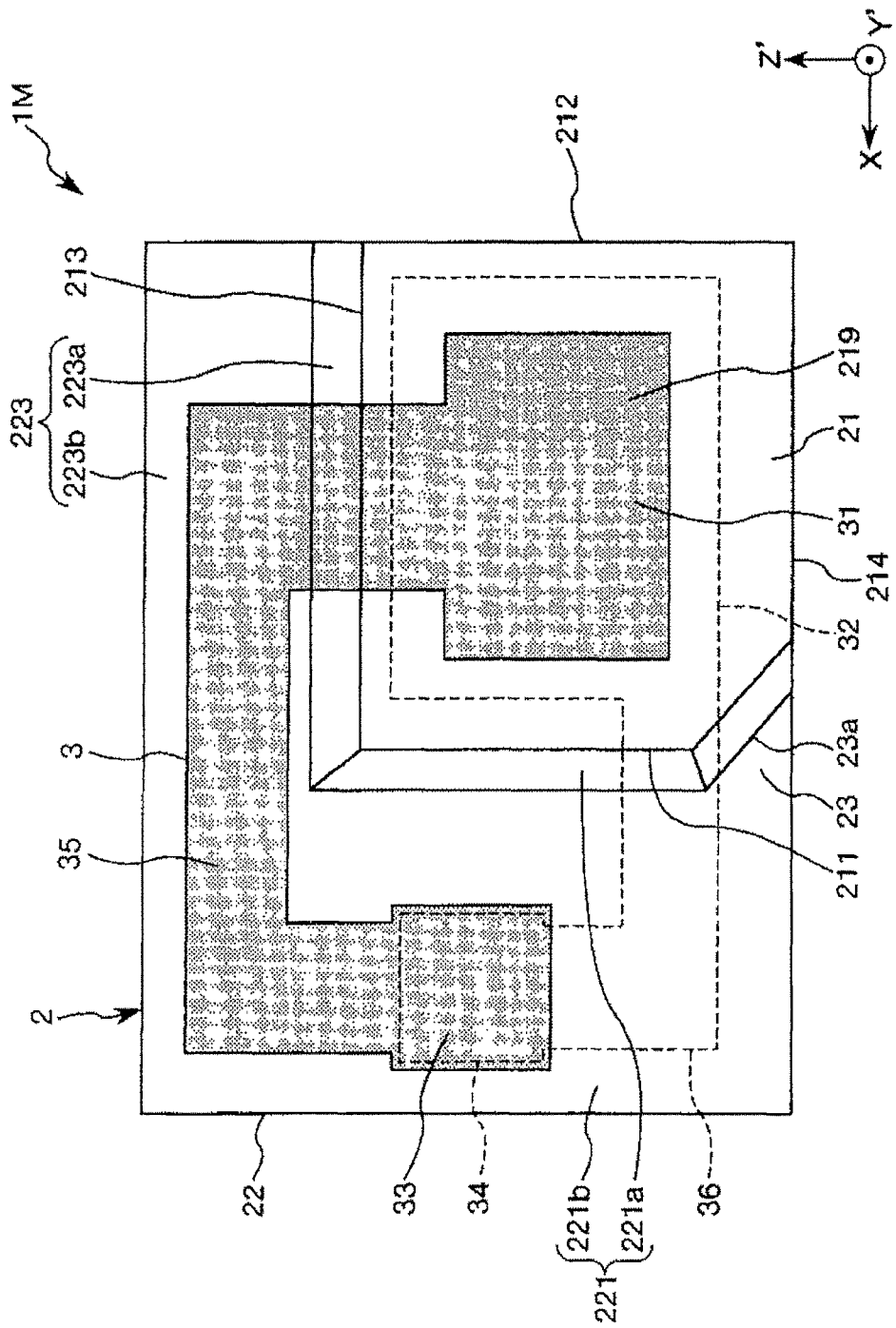
FIG. 28 is a plan view of a resonator element according to a fourteenth embodiment of the invention.

FIG. 28 is a plan view of a resonator element according to the fourteenth embodiment of the invention.

Hereinafter, the resonator element according to the fourteenth embodiment will be described mainly based on a difference from the above-described ninth embodiment, and description of the same content will not be repeated.

The resonator element according to the fourteenth embodiment of the invention is the same as the resonator element according to the ninth embodiment except that the piezoelectric substrate has a different configuration. In addition, the same constituent elements as the ones in the ninth embodiment are given the same reference numerals.

As illustrated in FIG. 28, in the resonator element 1M of the present embodiment, the second thick section 222 is omitted, and thus the second side 212 and the fourth side 214 of the vibration portion 21 are exposed from the thick portion 22. Accordingly, it is possible to further reduce mass of the front end side of the resonator element 1M than in the ninth embodiment.

The fourteenth embodiment can also exhibit the same effects as the ninth embodiment.

Fifteenth Embodiment

Next, a resonator element according to a fifteenth embodiment of the invention will be described.

Figure 29:
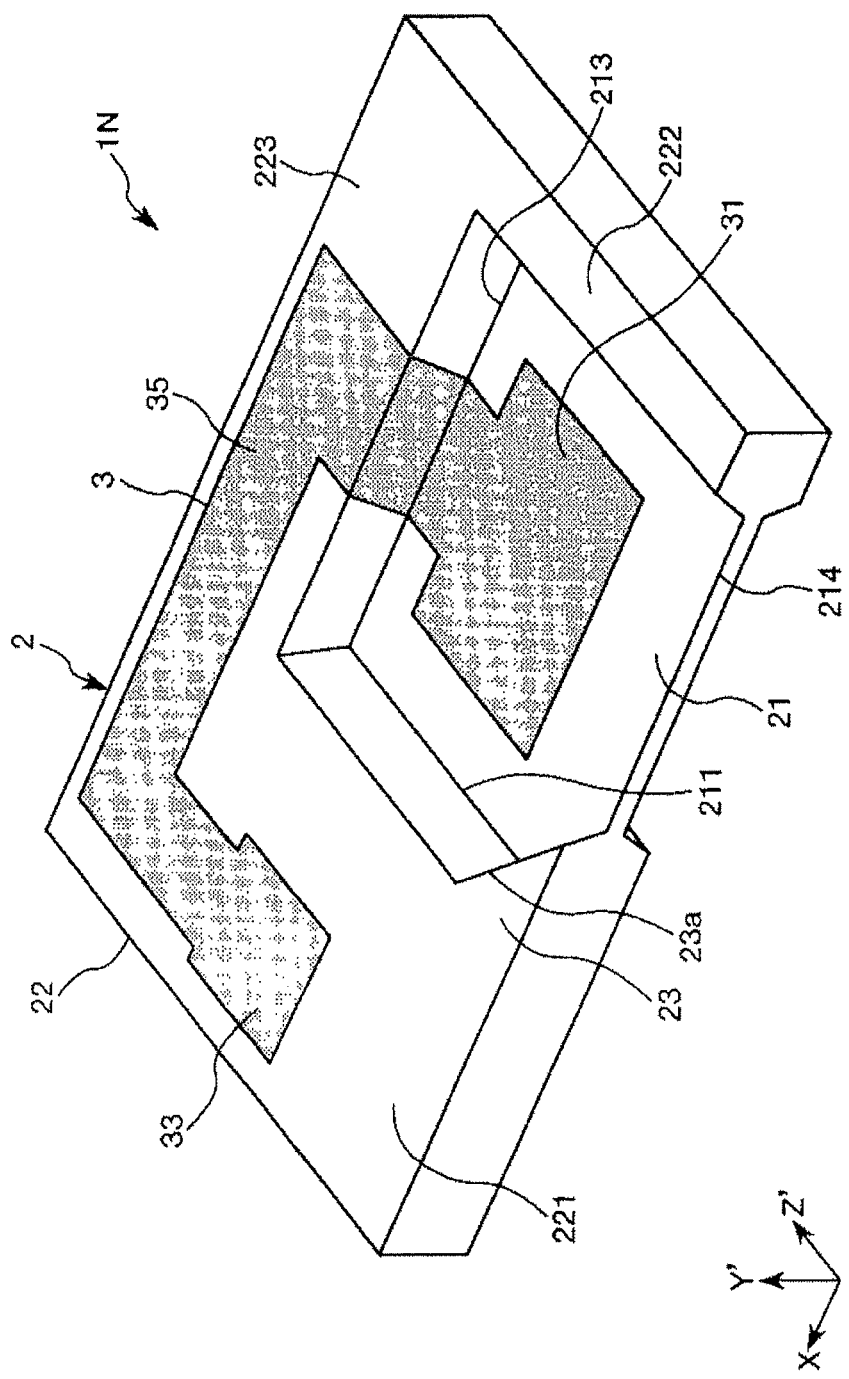
FIG. 29 is a perspective view of a resonator element according to a fifteenth embodiment of the invention.

FIG. 29 is a perspective view of a resonator element according to the fifteenth embodiment of the invention.

Hereinafter, the resonator element according to the fifteenth embodiment will be described mainly based on a difference from the above-described ninth embodiment, and description of the same content will not be repeated.

The resonator element according to the fifteenth embodiment of the invention is the same as the resonator element according to the ninth embodiment except that the piezoelectric substrate has a different configuration. In addition, the same constituent elements as the ones in the ninth embodiment are given the same reference numerals.

As illustrated in FIG. 29, in the resonator element 1N of the present embodiment, the vibration portion 21 is formed by forming recessed parts on both main surfaces of the piezoelectric substrate 2. In other words, the front surface (the main surface in the −Y' axis direction) of the thick portion 22 is provided so as to protrude further in the +Y' axis direction than the front surface (the main surface in the +Y' axis direction) of the vibration portion 21, and the rear surface (the main surface in the −Y' axis direction) of the thick portion 22 is provided so as to protrude further in the −Y' axis direction than the rear surface (the main surface in the −Y' axis direction) of the vibration portion 21. As mentioned above, the vibration portion 21 is formed by forming the recessed parts on both main surfaces of the piezoelectric substrate 2, and thus an etching depth of the recessed parts can be made smaller, for example, than in the ninth embodiment. For this reason, it is possible to perform etching with higher accuracy, and thus to obtain an outer shape of the piezoelectric substrate 2 with higher accuracy.

The fifteenth embodiment can also exhibit the same effects as the ninth embodiment.

2. Resonator

Next, a description will be made of a resonator (a resonator to which the invention is applied) which employs the above-described resonator element 1.

Figure 30:
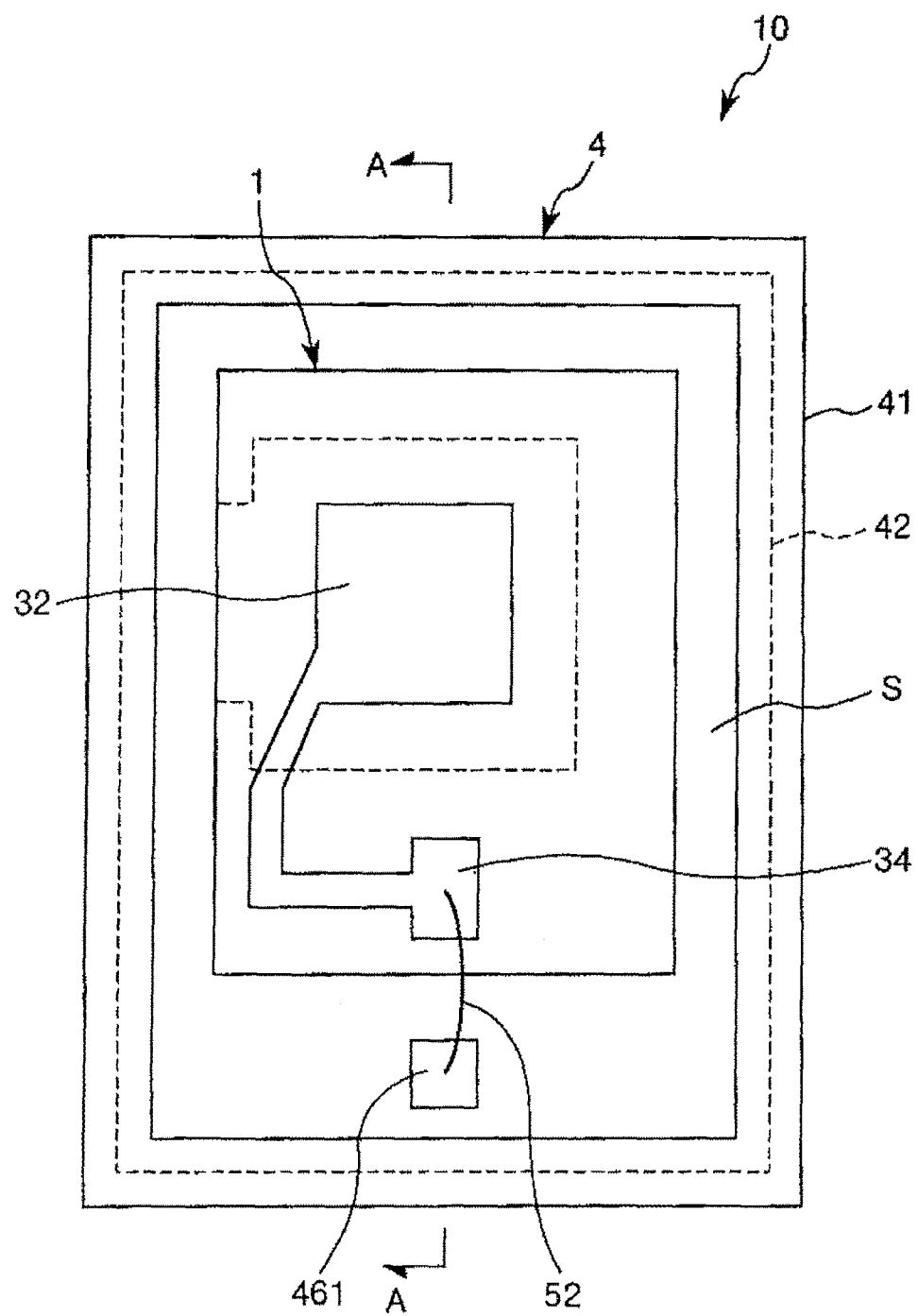
FIG. 30 is a plan view illustrating a resonator according to a preferred embodiment of the invention.
Figure 31:
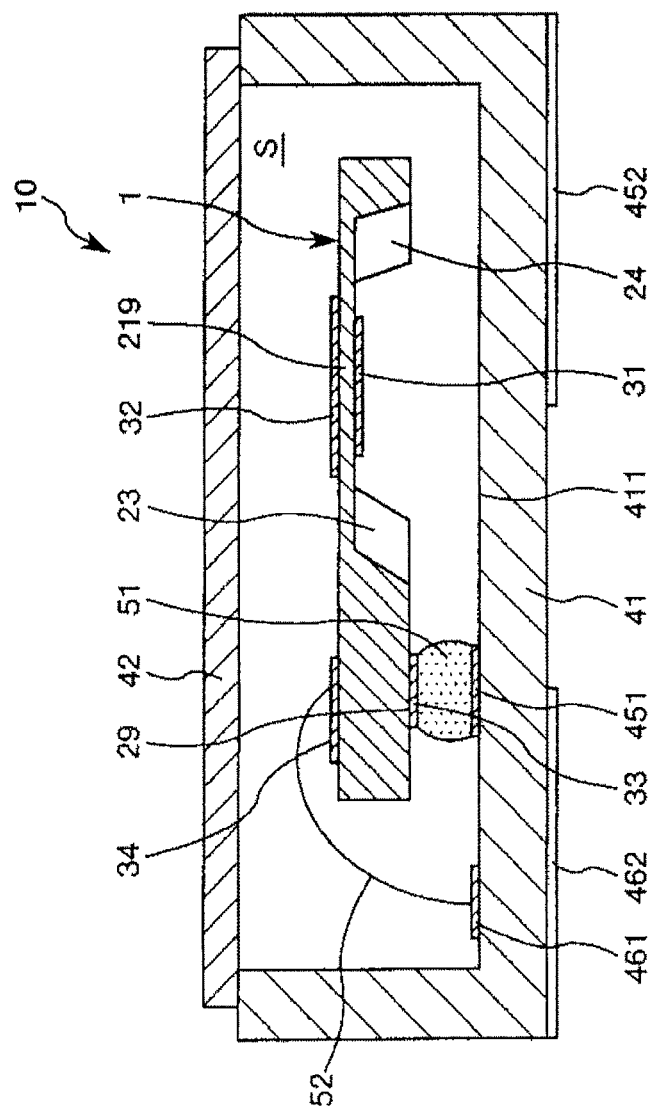
FIG. 31 is a cross-sectional view taken along the line A-A of FIG. 30.

FIG. 30 is a plan view of a resonator according to a preferred embodiment of the invention. FIG. 31 is a cross-sectional view taken along the line A-A of FIG. 30.

The resonator 10 illustrated in FIGS. 30 and 31 includes the above-described resonator element 1 and a package 4 which accommodates the resonator element 1 therein.

Package

The package 4 includes a box-shaped base 41 having a recess 411 which is opened upward, and a plate-shaped lid 42 which closes the opening of the recess 411 and is joined to the base 41. In addition, the resonator element 1 is stored in a storage space S which is formed by the lid 42 closing the recess 411. The storage space S may be in a decompressed (vacuum) state, and may be filled with an inert gas such as nitrogen, helium, or argon.

Although not particularly limited, various ceramics such as aluminum oxide may be used as a forming material of the base 41. In addition, although not particularly limited, a material with a linear expansion coefficient similar to that of a forming material of the base 41 may be used as a forming material of the lid 42. For example, in a case where the above-described ceramics are used as a forming material of the base 41, an alloy such as Kovar is preferably used. Further, joining between the base 41 and the lid 42 is not particularly limited, and may be performed, for example, using an adhesive, using seam welding, and the like.

Connection electrodes 451 and 461 are formed on a bottom of the recess 411 of the base 41. In addition, external mounting terminals 452 and 462 are formed on a lower surface of the base 41. The connection electrode 451 is electrically connected to the external mounting terminal 452 via a through electrode (not illustrated) formed in the base 41, and the connection electrode 461 is electrically connected to the external mounting terminal 462 via a through electrode (not illustrated) formed in the base 41.

The connection electrodes 451 and 461 and the external mounting terminals 452 and 462 are not particularly limited in configurations thereof as long as the electrodes and the terminals are conductive, but may be formed of, for example, metal coating films in which Ni (nickel), Au (gold), Ag (silver), or Cu (copper) is laminated on a metalized layer (base layer) such as Cr (chrome) or W (tungsten).

The resonator element 1 stored in the storage space S is installed in the base 41 using a conductive adhesive 51 so that the front surface (first main surface) of the vibration region 219 is directed to the base 41 side. The conductive adhesive 51 is provided so as to be in contact with the connection electrode 451 and the pad electrode 33. Accordingly, the connection electrode 451 is electrically connected to the pad electrode 33 via the conductive adhesive 51. The resonator element 1 is supported at one location (one point) by using the conductive adhesive 51, and, thus, for example, it is possible to minimize stress which occurs in the resonator element 1 due to a difference between thermal expansion coefficients of the base 41 and the piezoelectric substrate 2. In addition, a contact part between the conductive adhesive 51 and the resonator element 1 is preferably located on the X axis which passes through the centroid of the resonator element 1 in a plan view (when viewed from the XZ' plane). Therefore, it is possible to reduce the occurrence of rotational moment in the resonator element 1 with the conductive adhesive 51 as an axis when vibration (particularly, acceleration in the Y' axis direction) is applied to the resonator element 1. For this reason, it is possible to effectively reduce deformation of the vibration portion 21 when vibration is applied.

The conductive adhesive 51 is not particularly limited as long as the conductive adhesive is conductive and adhesive, and may use, for example, ones in which conductive fillers are dispersed in an adhesive based on silicone, epoxy, acryl, polyimide, bismaleimide, and the like.

In addition, although the description has been made using the conductive adhesive 51 in the embodiment, the invention is not limited thereto, and the resonator element 1 may be installed in the base 41 through a flip chip mounting technique by using a bump such as a gold bump, a solder bump, or a plated bump which is formed through plating.

The pad electrode 34 of the resonator element 1 is electrically connected to the connection electrode 461 via a bonding wire 52. As described above, the pad electrode 34 is disposed so as to oppose the pad electrode 33, and is thus located directly over the conductive adhesive 51 in a state in which the resonator element 1 is fixed to the base 41. For this reason, it is possible to reduce omission of vibration (ultrasonic vibration) given to the pad electrode 34 during wire bonding, and thus to more reliably perform connection of the bonding wire 52 to the pad electrode 34.

3. Oscillator

Next, a description will be made of an oscillator (an oscillator to which the invention is applied) which employs the above-described resonator.

Figure 32:
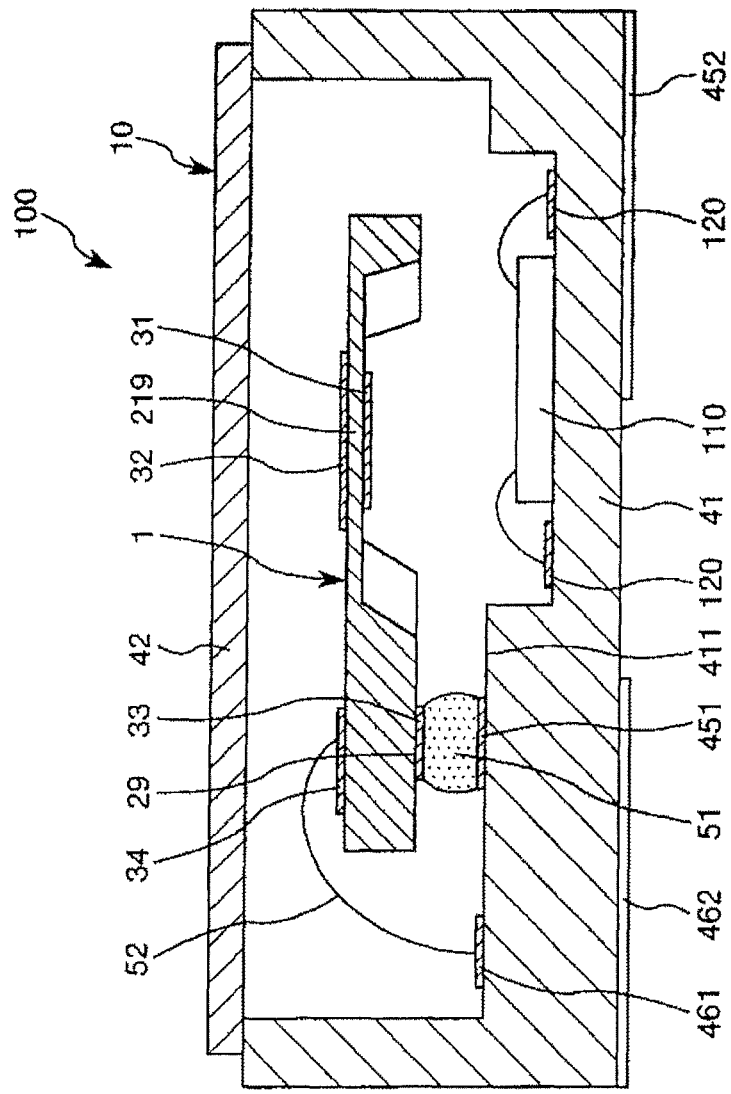
FIG. 32 is a cross-sectional view illustrating an oscillator according to a preferred embodiment of the invention.

FIG. 32 is a cross-sectional view illustrating an oscillator according to a preferred embodiment of the invention.

The oscillator 100 illustrated in FIG. 32 includes the resonator 10, and an IC chip 110 which drives the resonator element 1. Hereinafter, the oscillator 100 will be described mainly based on a difference from the above-described resonator, and description of the same content will not be repeated.

As illustrated in FIG. 32, in the oscillator 100, the IC chip 110 is fixed to the recess 411 of the base 41. The IC chip 110 is electrically connected to a plurality of internal terminals 120 formed on the bottom of the recess 411. The plurality of internal terminals 120 include terminals connected to the connection electrodes 451 and 461 and terminals connected to the external mounting terminals 452 and 462. The IC chip 110 includes an oscillation circuit which controls driving of the resonator element 1. When the IC chip 110 drives the resonator element 1, a signal of a predetermined frequency can be extracted.

4. Electronic Apparatus

Next, a description will be made of an electronic apparatus (an electronic apparatus to which the invention is applied) which employs the resonator to which the invention is applied.

Figure 33:
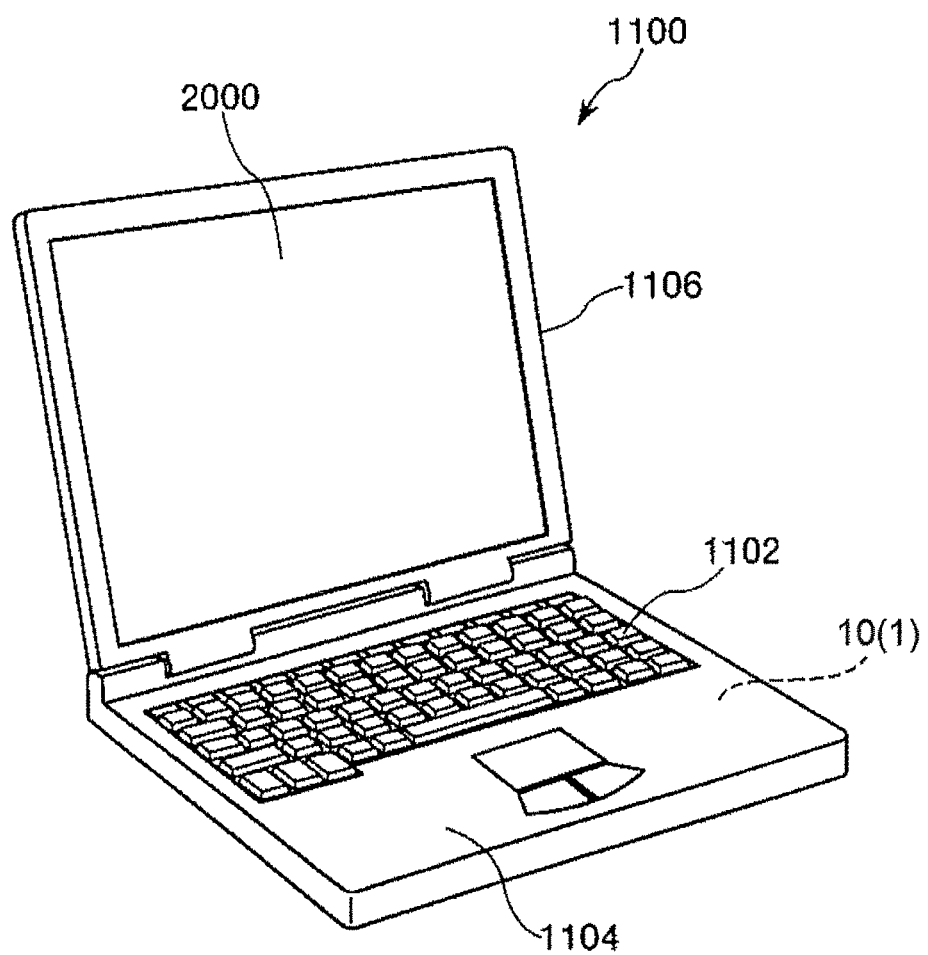
FIG. 33 is a perspective view illustrating a configuration of a mobile type (or a notebook type) personal computer as an example of an electronic apparatus to which the invention is applied.

FIG. 33 is a perspective view illustrating a configuration of a mobile type (or a notebook type) personal computer as an example of an electronic apparatus to which the invention is applied. In FIG. 33, a personal computer 1100 is constituted by a main body portion 1104 having a keyboard 1102 and a display unit 1106 having a display portion 2000, and the display unit 1106 is supported so as to be rotatably moved with respect to the main body portion 1104 via a hinge structure portion. The personal computer 1100 includes the resonator 10, embedded therein, which functions as a filter, a resonator, a reference clock and the like.

Figure 34:
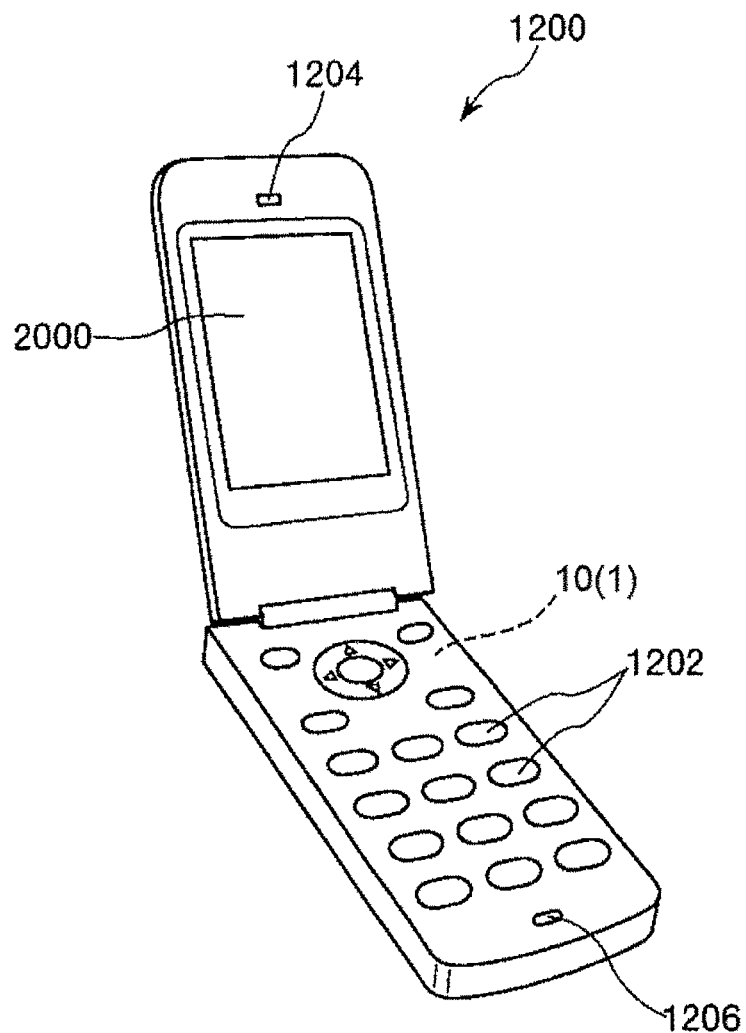
FIG. 34 is a perspective view illustrating a configuration of a mobile phone (including PHS) as an example of an electronic apparatus to which the invention is applied.

FIG. 34 is a perspective view illustrating a configuration of a mobile phone (including PHS) as an example of an electronic apparatus to which the invention is applied. In FIG. 34, a mobile phone 1200 includes a plurality of operation buttons 1202, an earpiece 1204, and a mouthpiece 1206, and a display portion 2000 is disposed between the operation buttons 1202 and the earpiece 1204. The mobile phone 1200 includes the resonator 10, embedded therein, which functions as a filter, a resonator, and the like.

Figure 35:
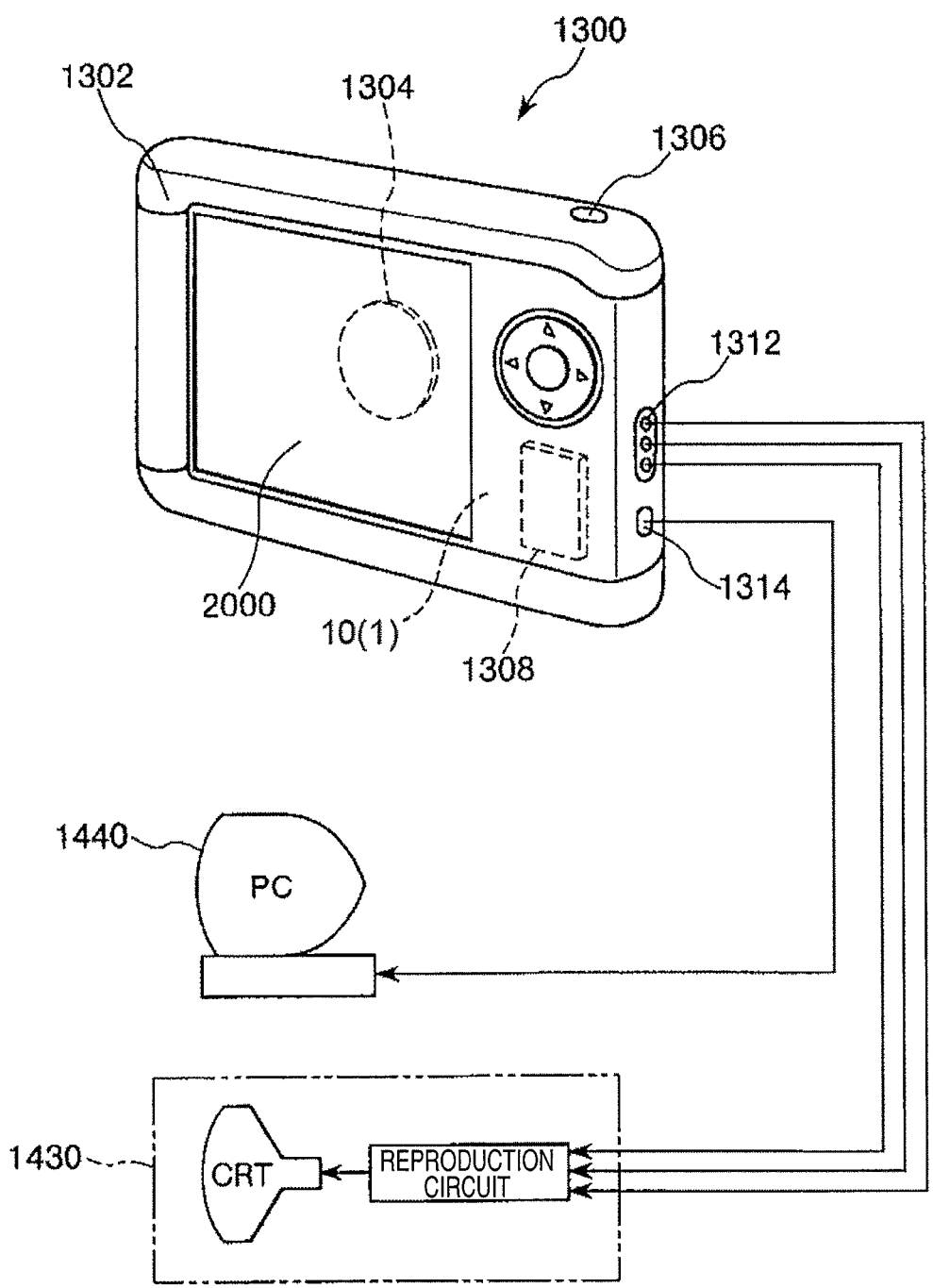
FIG. 35 is a perspective view illustrating a configuration of a digital still camera as an example of an electronic apparatus to which the invention is applied.

FIG. 35 is a perspective view illustrating a configuration of a digital still camera as an example of an electronic apparatus to which the invention is applied. In addition, in FIG. 35, connection to an external apparatus is also briefly illustrated. Here, a typical camera exposes a silver halide photography film to light using a light image of a subject, whereas the digital still camera 1300 performs photoelectric conversion on a light image of a subject by using an imaging device such as a charge coupled device (CCD) so as to generate an imaging signal (image signal).

A display portion is provided on a rear side of a case (body) 1302 of the digital still camera 1300 and performs display on the basis of an imaging signal generated by the CCD, and the display portion functions a view finder which displays a subject as an electronic image. In addition, a light sensing unit 1304 which includes an optical lens (imaging optical system), a CCD, and the like is provided on a front side (the rear side in FIG. 35) of the case 1302.

When a photographer confirms a subject image displayed on the display portion and presses a shutter button 1306, an imaging signal of the CCD at this point is transmitted to and stored in a memory 1308. In addition, in this digital still camera 1300, video signal output terminals 1312 and input and output terminals 1314 for data communication are provided on a side surface of the case 1302. Further, as illustrated in FIG. 35, the video signal output terminals 1312 are connected to a television monitor 1430 and the input and output terminals 1314 for data communication are connected to a personal computer (PC) 1440 as necessary. Furthermore, an imaging signal stored in the memory 1308 is output to the television monitor 1430 or the personal computer 1440 through a predetermined operation. The digital still camera 1300 includes the resonator 10, embedded therein, which functions as a filter, a resonator, a reference clock, and the like.

Further, the electronic apparatus including the resonator element to which the invention is applied is applicable to, for example, an ink jet type ejection apparatus (for example, an ink jet printer), a laptop type personal computer, a television, a video camera, a video tape recorder, a car navigation apparatus, a pager, an electronic organizer (including a communication function), an electronic dictionary, an electronic calculator, an electronic gaming machine, a wordprocessor, a workstation, a videophone, a security television monitor, an electronic binocular, a POS terminal, a medical apparatus (for example, an electronic thermometer, a sphygmomanometer, a blood glucose monitoring system, an electrocardiographic apparatus, an ultrasonic diagnostic apparatus, or an electronic endoscope), a fish-finder, various measurement apparatuses, meters and gauges (for example, meters and gauges of vehicles, aircrafts, and ships), a flight simulator, and the like, in addition to the personal computer (a mobile type personal computer) of FIG. 33, the mobile phone of FIG. 34, and the digital camera of FIG. 35.

5. Moving Object

Next, a description will be made of a moving object (a moving object to which the invention is applied) which employs the resonator to which the invention is applied.

Figure 36:
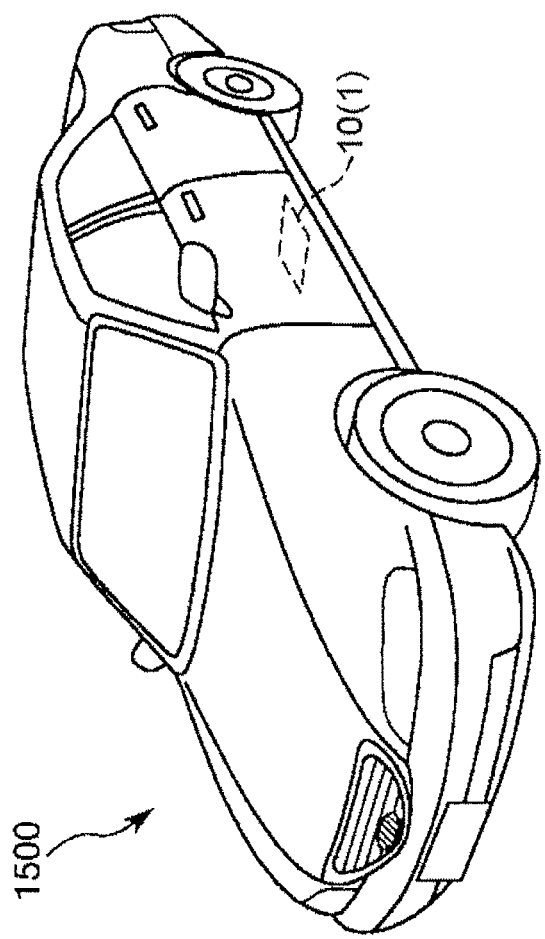
FIG. 36 is a perspective view schematically illustrating an automobile as an example of a moving object to which the invention is applied.

FIG. 36 is a perspective view schematically illustrating an automobile as an example of a moving object to which the invention is applied. The automobile 1500 includes the resonator 10 mounted therein. The resonator 10 is widely applicable to electronic control units (ECU) such as, for example, a keyless entry, an immobilizer, a car navigation system, a car air conditioner, an antilock brake system (ABS), an air bag, a tire pressure monitoring system (TPMS), engine control, a battery monitor of a hybrid car or an electric car, and a vehicle dynamic control system.

As mentioned above, although the resonator element, the resonator, the oscillator, the electronic apparatus, and the moving object according to the embodiments of the invention have been described in detail, the invention is not limited thereto, and a configuration of each part may be replaced with any configuration having the same function. In addition, any other configuration may be added to the invention. Further, the above-described embodiments may be combined as appropriate.

In addition, although the vibration portion has a rectangular shape in a plan view in the above-described embodiments (first to seventh embodiments), a shape of the vibration portion is not limited thereto. In other words, although, in the above-described embodiments, a description has been made that the first to fourth sides of the contour of the vibration portion are respectively formed in the straight lines, each side may be entirely curved, and may be curved on the way. The sides may be continuously connected to each other.

Although, in the above-described embodiments, the quartz crystal substrate is used as a piezoelectric substrate, alternatively, various piezoelectric substrates such as, for example, Lithium Niobate ($LiNbO_3$), Lithium Tantalate ($LiTaO_3$), Lead Zirconate Titanate (PZT), Lithium Tetraborate ($Li_2B_4O_7$) and Langasite crystal ($La_3Ga_5SiO_{14}$) may be used.

The entire disclosure of Japanese Patent Application No. 2013-042583, filed Mar. 5, 2013, Japanese Patent Application No. 2013-075016, filed Mar. 29, 2013, and Japanese Patent Application No. 2014-011902, filed Jan. 24, 2014 is expressly incorporated by reference herein.

What is claimed is:

1. A resonator element comprising:
    a substrate that includes a first region having a vibration region which performs thickness shear vibration, and a second region which is integrally formed with an outer edge excluding a partial outer edge in an outer edge of the first region and which is thicker than the first region;
    a pair of excitation electrodes that are respectively provided on a first main surface and a second main surface of the vibration region which are in front and rear relationships; and
    a beam portion that is provided along the outer edge of the first region which does not overlap the outer edge excluding a partial outer edge in the outer edge of the first region, and that is thicker than the first region, when viewed along the first and second main surfaces and from a direction perpendicular to a vibration direction of the thickness shear vibration,
    wherein a contour of the first region includes
    first and second sides that are arranged with the first region interposed therebetween and are formed in the direction perpendicular to the vibration direction in plan view;
    a third side that connects one end of the first side to one end of the second side and is formed in the vibration direction; and
    a fourth side that connects the other end of the first side to the other end of the second side and is formed in the vibration direction,
    wherein the second region includes
    a first thick portion that is provided along the first side;
    a second thick portion that is provided along the second side; and
    a third thick portion that is provided along the third side, and
    wherein the beam portion is provided along the fourth side, and is connected to one of the first thick portion and the second thick portion, the beam portion having a same thickness as that of the second region such that the beam portion flushes with the second region in a direction perpendicular to the first and second main surfaces, the beam portion protruding from the one of the first thick portion and the second thick portion toward the other of the first thick portion and the second thick portion.

2. The resonator element according to claim 1,
    wherein, when a length of the beam portion in the vibration direction is set to L1, and a thickness of the vibration portion is set to $D_2$, a relationship of $10 \times D_2 \leq L1 \leq 15 \times D_2$ is satisfied.

3. A resonator comprising:
    the resonator element according to claim 2; and
    a package that accommodates the resonator element therein.

4. An oscillator comprising:
    the resonator element according to claim 2; and
    a circuit that drives the resonator element.

5. An electronic apparatus comprising the resonator element according to claim 2.

6. A moving object comprising the resonator element according to claim 2.

7. The resonator element according to claim 1,
    wherein, when a width of the beam portion in the direction perpendicular to the vibration direction is set to W1 and a thickness of the vibration portion is set to $D_2$, a relationship of $3 \times D_2 \leq W1 \leq 10 \times D_2$ is satisfied.

8. The resonator element according to claim 1,
    wherein an edge of the beam portion includes a tilt edge part that is tilted with respect to the vibration direction of the thickness shear vibration and the direction perpendicular to the vibration direction in a plan view.

9. The resonator element according to claim 8,
    wherein a tilt angle of the tilt edge part relative to the vibration direction is between 30° and 60°, inclusive.

10. The resonator element according to claim 1,
    wherein a fixation portion which is installed in a target object is provided in the first thick portion, and wherein a length of the second thick portion in the vibration direction of the thickness shear vibration is between 40 µm and 100 µm, inclusive.

11. A resonator comprising:

the resonator element according to claim 1; and a package that accommodates the resonator element therein.

12. An oscillator comprising:

the resonator element according to claim 1; and a circuit that drives the resonator element.

13. An electronic apparatus comprising the resonator element according to claim 1.

14. A moving object comprising the resonator element according to claim 1.

* * * * *